(12) United States Patent
Kim et al.

(10) Patent No.: US 11,270,766 B2
(45) Date of Patent: Mar. 8, 2022

(54) MEMORY SYSTEM AND METHOD OF OPERATING THE SAME

(71) Applicant: SK hynix Inc., Icheon-si (KR)

(72) Inventors: Dae Sung Kim, Icheon-si (KR); Kyung Bum Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 49 days.

(21) Appl. No.: 16/928,989

(22) Filed: Jul. 14, 2020

(65) Prior Publication Data
US 2021/0208813 A1  Jul. 8, 2021

(30) Foreign Application Priority Data
Jan. 2, 2020 (KR) .................. 10-2020-0000274

(51) Int. Cl.
| | |
|---|---|
| G11C 11/56 | (2006.01) |
| G11C 16/26 | (2006.01) |
| G11C 16/04 | (2006.01) |
| G11C 7/00 | (2006.01) |
| G11C 7/10 | (2006.01) |
| G11C 16/34 | (2006.01) |

(52) U.S. Cl.
CPC ............ G11C 11/5642 (2013.01); G11C 7/00 (2013.01); G11C 7/10 (2013.01); G11C 11/5671 (2013.01); G11C 16/0483 (2013.01); G11C 16/26 (2013.01); *G11C 16/349* (2013.01)

(58) Field of Classification Search
CPC ... G11C 11/5642; G11C 7/00; G11C 11/5671; G11C 7/10; G11C 16/16; G11C 16/0483

USPC .................................................. 365/189.15
See application file for complete search history.

(56) References Cited

U.S. PATENT DOCUMENTS

| 9,741,402 B2* | 8/2017 | Jeon ...................... G11C 7/12 |
| 2017/0140802 A1* | 5/2017 | Jeon ................ G11C 11/5642 |

FOREIGN PATENT DOCUMENTS

| KR | 10-1423962 B1 | 7/2014 |
| KR | 10-2017-0058066 A | 5/2017 |
| KR | 10-2017-0142714 A | 12/2017 |
| KR | 10-2018-0070974 A | 6/2018 |

* cited by examiner

*Primary Examiner* — Xiaochun L Chen
(74) *Attorney, Agent, or Firm* — Perkins Coie LLP

(57) ABSTRACT

A memory system may include a memory device and a memory controller. The memory device may include memory cells. The memory controller may estimate and use an read voltage to distinguish one or more memory cells corresponding to a first threshold voltage distribution from one or more memory cells corresponding to a second threshold voltage distribution, the read voltage being estimated based on standard deviations and average threshold voltages of the first and the second threshold voltage distributions and probability density functions corresponding to the first and the second threshold voltage distributions, respectively. The memory controller may be structured and operable to calculate the standard deviation of the first threshold voltage distribution, based on a first probability area distinguished by a first target read voltage, a second probability area distinguished by a second target read voltage, and inverse Q-function values corresponding to the first and the second probability areas.

37 Claims, 15 Drawing Sheets

FIG. 5
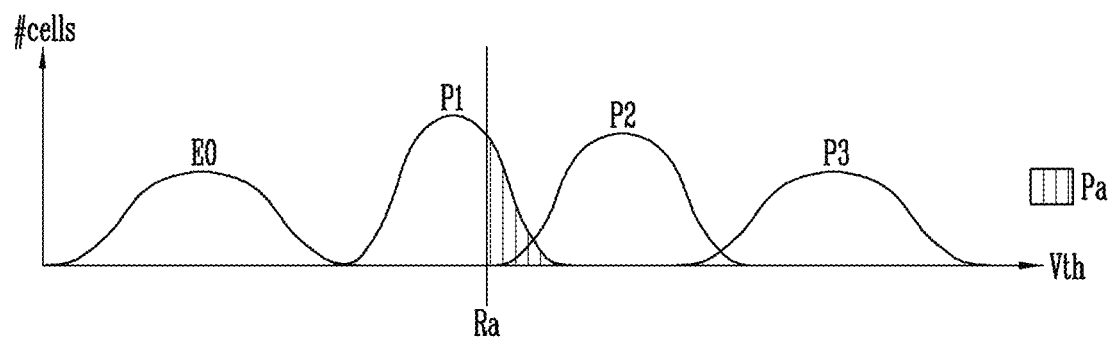
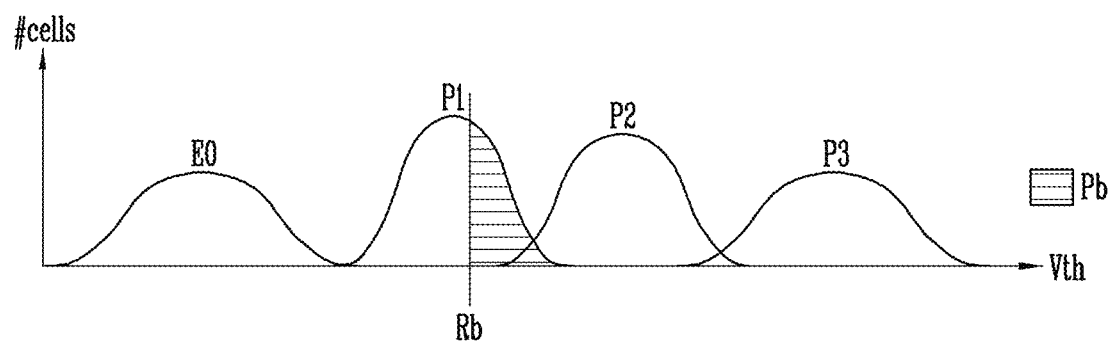
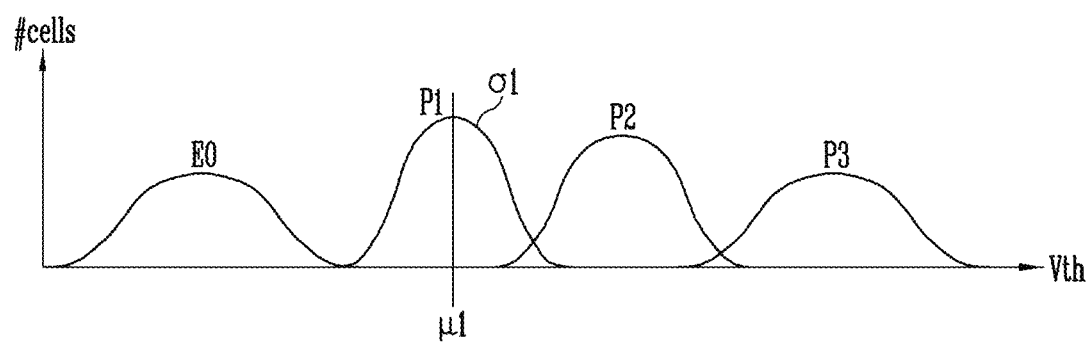

FIG. 6
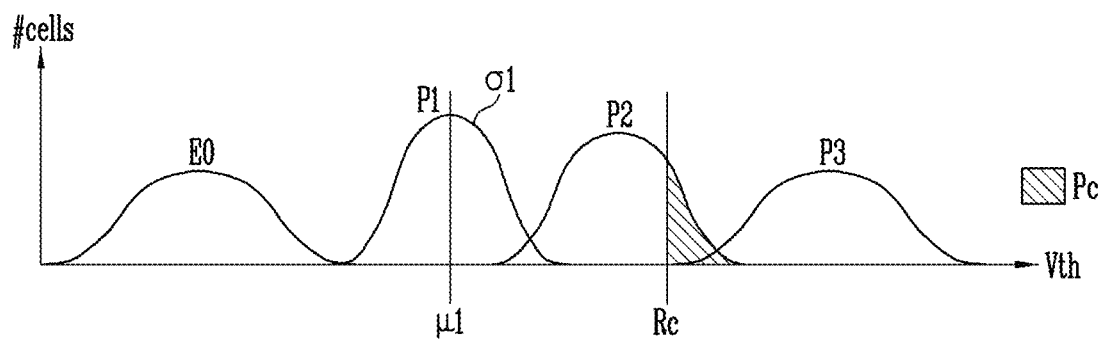
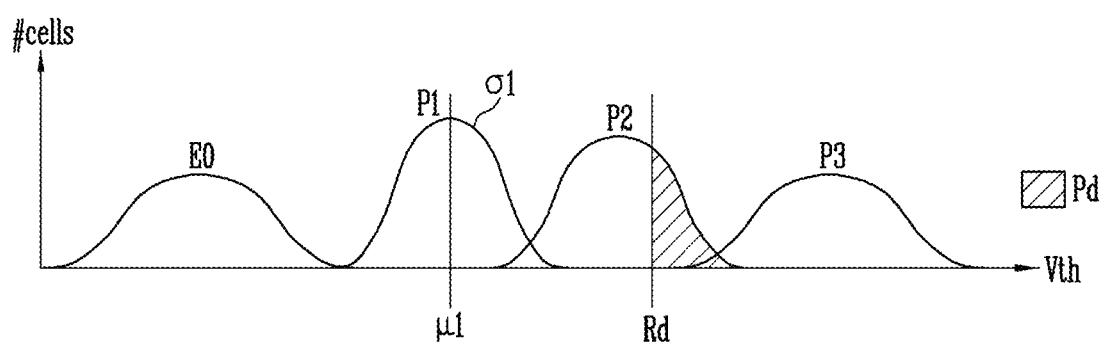
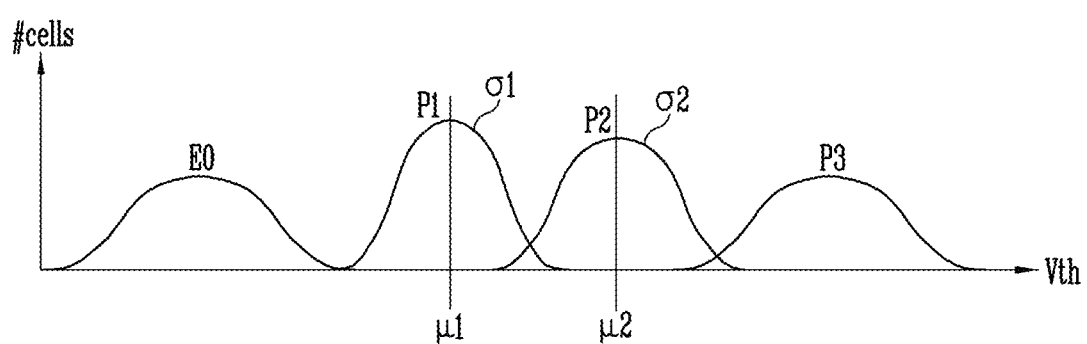

FIG. 11
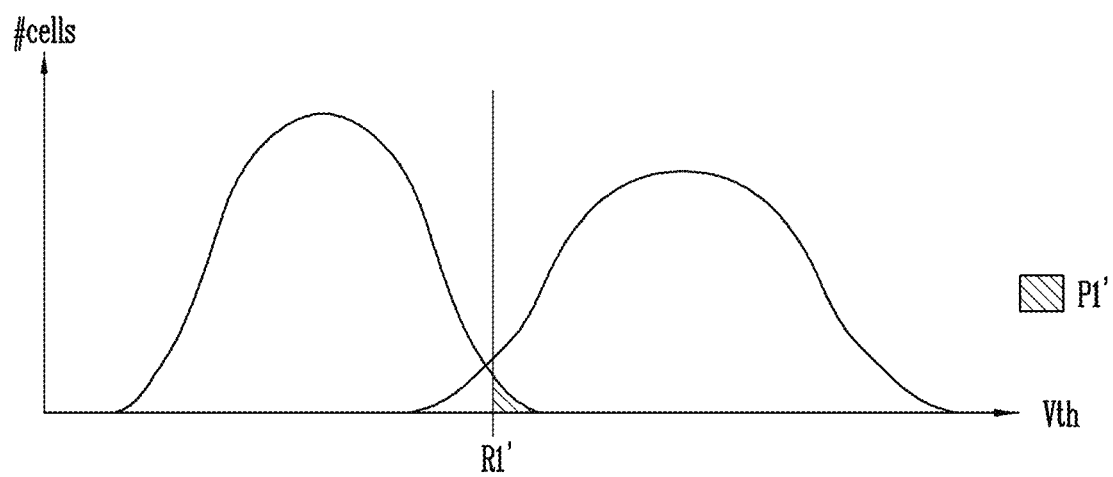
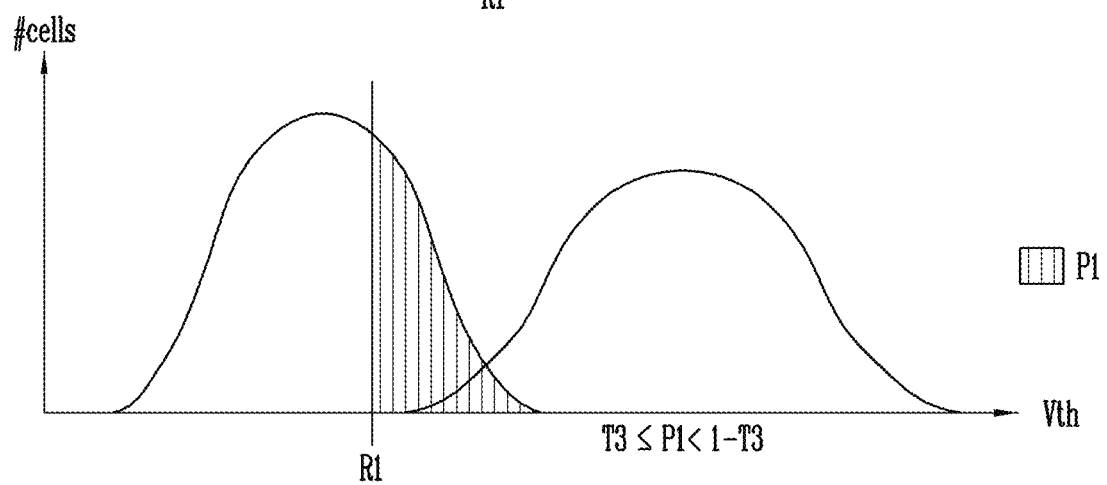

FIG. 12

<First table>

| CHANNEL CHARACTERISTICS | | STATE | E0 | P1 | P2 | P3 | P4 | P5 | P6 | P7 |
|---|---|---|---|---|---|---|---|---|---|---|
| 0 ≤ P/E < 999 | 0 ≤ R/T < 999 | STANDARD DEVIATION RATIO | 1.4 | 1 | 1.01 | 1.02 | 1.03 | 1.04 | 1.05 | 1.5 |
| | 1000 ≤ R/T < 1999 | STANDARD DEVIATION RATIO | 1.5 | 1 | 1.02 | 1.03 | 1.04 | 1.05 | 1.06 | 1.6 |
| | ... | ... | ... | ... | ... | ... | ... | ... | ... | ... |
| 1000 ≤ P/E < 1999 | 0 ≤ R/T < 999 | STANDARD DEVIATION RATIO | 1.5 | 1 | 1.02 | 1.04 | 1.06 | 1.08 | 1.09 | 1.6 |
| | 1000 ≤ R/T < 1999 | STANDARD DEVIATION RATIO | 1.6 | 1 | 1.03 | 1.05 | 1.07 | 1.09 | 1.11 | 1.7 |
| | ... | ... | ... | ... | ... | ... | ... | ... | ... | ... |

FIG. 13

<Second table>

| CHANNEL CHARACTERISTICS | | STATE | E0-P1 | P1-P2 | P2-P3 | ... | P5-P6 | P6-P7 |
|---|---|---|---|---|---|---|---|---|
| 0 ≤ P/E < 999 | 0 ≤ R/T < 999 | WEIGHTED VALUE | $\alpha_{11}, \beta_{11}$ | $\alpha_{21}, \beta_{21}$ | $\alpha_{31}, \beta_{31}$ | ... | $\alpha_{61}, \beta_{61}$ | $\alpha_{71}, \beta_{71}$ |
| | 1000 ≤ R/T < 1999 | WEIGHTED VALUE | $\alpha_{12}, \beta_{12}$ | $\alpha_{22}, \beta_{22}$ | $\alpha_{32}, \beta_{32}$ | ... | $\alpha_{62}, \beta_{62}$ | $\alpha_{72}, \beta_{72}$ |
| | ... | ... | ... | ... | ... | ... | ... | ... |
| 1000 ≤ P/E < 1999 | 0 ≤ R/T < 999 | WEIGHTED VALUE | $\alpha_{13}, \beta_{13}$ | $\alpha_{23}, \beta_{23}$ | $\alpha_{33}, \beta_{33}$ | ... | $\alpha_{63}, \beta_{63}$ | $\alpha_{73}, \beta_{73}$ |
| | 1000 ≤ R/T < 1999 | WEIGHTED VALUE | $\alpha_{14}, \beta_{14}$ | $\alpha_{24}, \beta_{24}$ | $\alpha_{34}, \beta_{34}$ | ... | $\alpha_{64}, \beta_{64}$ | $\alpha_{74}, \beta_{74}$ |
| | ... | ... | ... | ... | ... | ... | ... | ... |

FIG. 14

<Third table>

| CHANNEL CHARACTERISTICS | | STATE | E0-P1 | P1-P2 | P2-P3 | ... | P5-P6 | P6-P7 |
|---|---|---|---|---|---|---|---|---|
| 0 ≤ P/E < 999 | 0 ≤ R/T < 999 | OFFSET VALUE | $\gamma_{11}$ | $\gamma_{21}$ | $\gamma_{31}$ | ... | $\gamma_{61}$ | $\gamma_{71}$ |
| | 1000 ≤ R/T < 1999 | OFFSET VALUE | $\gamma_{12}$ | $\gamma_{22}$ | $\gamma_{32}$ | ... | $\gamma_{62}$ | $\gamma_{72}$ |
| | ... | ... | ... | ... | ... | ... | ... | ... |
| 1000 ≤ P/E < 1999 | 0 ≤ R/T < 999 | OFFSET VALUE | $\gamma_{13}$ | $\gamma_{23}$ | $\gamma_{33}$ | ... | $\gamma_{63}$ | $\gamma_{73}$ |
| | 1000 ≤ R/T < 1999 | OFFSET VALUE | $\gamma_{14}$ | $\gamma_{24}$ | $\gamma_{34}$ | ... | $\gamma_{64}$ | $\gamma_{74}$ |
| | ... | ... | ... | ... | ... | ... | ... | ... |

MEMORY SYSTEM AND METHOD OF OPERATING THE SAME

CROSS-REFERENCE TO RELATED APPLICATION

This patent document claims priority to and benefits of the Korean patent application number 10-2020-0000274, filed on Jan. 2, 2020, which is incorporated herein by reference in its entirety.

TECHNICAL FIELD

The present disclosure generally relates to an electronic device, and more particularly, to a memory system including a memory controller.

BACKGROUND

Various embodiments of the disclosed technology generally relate to a memory system and a method of operating the memory system, and more particularly, to a memory system capable of enhancing the reliability of data, and a method of operating the memory system.

Memory systems may include a memory controller and a memory device.

The memory controller may control the operation of the memory system in response to a request from a host. The memory device may store data or output the stored data under control of the memory controller. For example, the memory device is formed of volatile memory devices in which data stored therein is lost when power is turned off, or nonvolatile memory devices which can retain data stored therein even when power supply is interrupted.

SUMMARY

The embodiments of the disclosed technology, among other features and benefits, relate to a memory system and operating method capable of estimating an optimum read voltage so that data decoding may be performed with enhanced reliability.

An embodiment of the disclosed technology may provide for a memory system including: a memory device including a plurality of memory cells and a memory controller configured to estimate and use an read voltage to distinguish one or more memory cells corresponding to a first threshold voltage distribution indicating first read-out data from one or more memory cells corresponding to a second threshold voltage distribution indicating second read-out data, the first and second threshold voltage distribution being adjacent to each other among a plurality of threshold voltage distributions corresponding to the memory cells, the read voltage being estimated based on standard deviations and average threshold voltages of the first and the second threshold voltage distributions and probability density functions corresponding to the first and the second threshold voltage distributions, respectively, wherein the memory controller is structured and operable to calculate the standard deviation of the first threshold voltage distribution, based on a first probability area corresponding to a first section of the first threshold voltage distribution distinguished by a first target read voltage, a second probability area corresponding to a second section of the first threshold voltage distribution distinguished by a second target read voltage, and inverse Q-function values respectively corresponding to the first and the second probability areas.

An embodiment of the disclosed technology may provide for a method of operating a memory system including: calculating standard deviations and average threshold voltages of first and second threshold voltage distributions, the first threshold voltage distribution corresponding to memory cells storing first read-out data, the second threshold voltage distribution corresponding to memory cells storing second read-out data, a number of memory cells for first and second read-out data being expressed as a function of the threshold voltage to obtain first and second threshold voltage distribution, the first and second threshold voltage distribution being adjacent to each other among a plurality of threshold voltage distributions corresponding to a plurality of memory cells and estimating an read voltage between the first and the second threshold voltage distributions based on probability density functions corresponding to the first and the second threshold voltage distributions, respectively, wherein calculating the standard deviation of the first threshold voltage distribution comprises calculating the standard deviation of the first threshold voltage distribution, based on a first probability area corresponding to a first section of the first threshold voltage distribution distinguished by a first target read voltage, a second probability area corresponding to a second section of the first threshold voltage distribution distinguished by a second target read voltage, and inverse Q-function values respectively corresponding to the first and the second probability areas.

An embodiment of the disclosed technology may provide for a memory system including: a memory device including a plurality of memory cells; and a memory controller configured to estimate an optimum read voltage between first and second threshold voltage distributions adjacent to each other among a plurality of threshold voltage distributions corresponding to the memory cells, based on standard deviations and average threshold voltages of the first and the second threshold voltage distributions and probability density functions corresponding to the first and the second threshold voltage distributions. The memory controller may calculate the standard deviation of the first threshold voltage distribution, based on a first probability area of a first section distribution distinguished by a first target read voltage in the first threshold voltage distribution, a second probability area of a second section distribution distinguished by a second target read voltage in the first threshold voltage distribution, and inverse Q-function values respectively corresponding to the first and the second probability areas.

An embodiment of the disclosed technology may provide for a method of operating a memory system including: calculating standard deviations and average threshold voltages of first and second threshold voltage distributions adjacent to each other among a plurality of threshold voltage distributions corresponding to a plurality of memory cells; and estimating an optimum read voltage between the first and the second threshold voltage distributions based on probability density functions corresponding to the first and the second threshold voltage distributions. Calculating the standard deviation of the first threshold distribution may include calculating the standard deviation of the first threshold voltage distribution, based on a first probability area of a first section distribution distinguished by a first target read voltage in the first threshold voltage distribution, a second probability area of a second section distribution distinguished by a second target read voltage in the first threshold voltage distribution, and inverse Q-function values respectively corresponding to the first and the second probability areas.

In another embodiment of the disclosed technology, a memory system may include a memory device including a plurality of memory cells and a memory controller configured to estimate and use an optimum read voltage to distinguish one or more memory cells corresponding to a first threshold voltage distribution indicating first read-out data from one or more memory cells corresponding to a second threshold voltage distribution indicating second read-out data, a number of memory cells for first and second read-out data being expressed as a function of the threshold voltage to obtain first and second threshold voltage distribution curves, the first and second threshold voltage distribution curves being adjacent to each other among a plurality of threshold voltage distribution curves corresponding to the memory cells, the optimum read voltage being estimated based on standard deviations and average threshold voltages of the first and the second threshold voltage distributions and probability density functions corresponding to the first and the second threshold voltage distributions, respectively. The memory controller is structured and operable to calculate the standard deviation of the first threshold voltage distribution, based on a first probability area corresponding to a first section of the first threshold voltage distribution curve distinguished by a first target read voltage, a second probability area corresponding to a second section of the first threshold voltage distribution curve distinguished by a second target read voltage, and inverse Q-function values respectively corresponding to the first and the second probability areas.

BRIEF DESCRIPTION OF THE DRAWINGS

FIG. 5 is a diagram for describing a method of estimating a standard deviation and an average threshold voltage based on an embodiment of the disclosed technology.

FIG. 6 is a diagram for describing a method of estimating a standard deviation and an average threshold voltage based on an embodiment of the disclosed technology.

FIGS. 9 to 11 are diagrams for describing a method of determining a target read voltage based on an embodiment of the disclosed technology.

FIG. 12 is a diagram for describing a first table based on an embodiment of the disclosed technology.

FIG. 13 is a diagram for describing a second table based on an embodiment of the disclosed technology.

FIG. 14 is a diagram for describing a third table based on an embodiment of the disclosed technology.

DETAILED DESCRIPTION

Specific structural or functional descriptions in the embodiments of the disclosed technology introduced in this specification or application are only for description of the embodiments of the disclosed technology. The descriptions should not be construed as being limited to the embodiments described in the specification or application.

Figure 1:
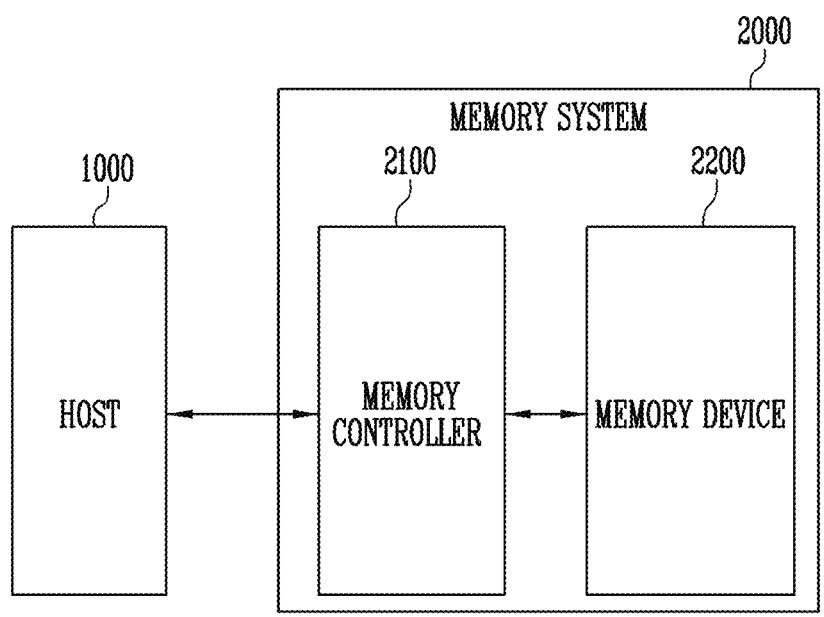
FIG. 1 is a diagram illustrating a memory system based on an embodiment of the disclosed technology.

FIG. 1 is a diagram illustrating a memory system 2000 based on an embodiment of the disclosed technology.

Referring to FIG. 1, the memory system 2000 may include a memory device 2200 configured to store data, and a memory controller 2100 configured to control the memory device 2200 in response to a request of a host 1000.

The host 1000 may be a device or system configured to store data in the memory system 2000 or retrieve the data from the memory system 2000. For example, the host 1000 may include at least one of a computer, a portable digital device, a tablet PC, a digital camera, a digital audio player, a television, a wireless communication device, and a cellular phone, but embodiments of the disclosed technology are not limited thereto.

The memory controller 2100 may control the overall operation of the memory system 2000. The memory controller 2100 may perform various operations in response to requests from the host 1000. The memory controller 2100 may perform at least one of a program operation of storing data in the memory device 2200, a read operation of reading the data stored in the memory device 2200, and an erase operation of erasing the data stored in the memory device 2200.

The memory device 2200 may be formed of a volatile memory device in which data stored therein is lost when power is turned off, or a nonvolatile memory device which can retain data stored therein even when power supply is interrupted. The memory device 2200 may perform, e.g., a program operation, a read operation, and an erase operation under control of the memory controller 2100.

The memory device 2200 may include at least one storage area for storing data. The storage area may correspond to one page including a plurality of memory cells, one memory block including a plurality of pages, one plane including a plurality of blocks, or one die including a plurality of planes, but embodiments of the disclosed technology are not limited thereto.

The storage area may be classified into a single-level cell (SLC) area and a multi-level cell (MLC) area depending on the number of bits which can be stored in each of memory cells included in the storage area. For example, 1-bit data may be stored in each of SLCs included in the SLC area, and m-bit data may be stored in each of m-bit MLCs included in the m-bit MLC area. Here, m may be a natural number of 2 or more.

Figure 2:
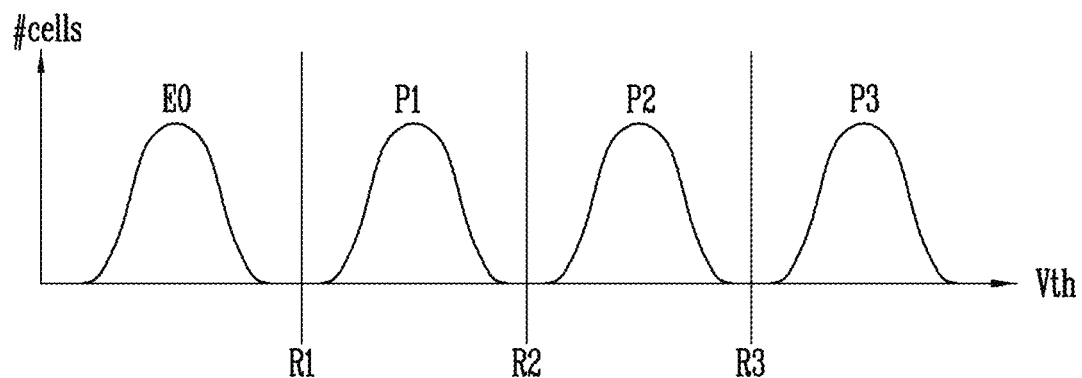
FIG. 2 is a diagram for explaining threshold voltage distributions of memory cells.

FIG. 2 is a diagram for explaining threshold voltage distributions of memory cells, where the number of cells (#cells) for each program/erase state is plotted as a function of the threshold voltage (Vth).

Although FIG. 2 illustrates threshold voltage distributions of memory cells included in a 2-bit MLC area, embodiments of the disclosed technology are not limited thereto. In FIG. 2, a horizontal axis may indicate the threshold voltage Vth of the memory cells, and a vertical axis may indicate the number of memory cells (#cells) corresponding to the threshold voltage Vth.

Each of the memory cells included in the 2-bit MLC area may have a threshold voltage corresponding to any one of an erased state E0, a first programmed state P1, a second programmed state P2, and a third programmed state P3.

Ideal threshold voltage distributions corresponding to the states E0, P1, P2, and P3 may not overlap with each other. For example, a program operation may be performed on the memory cells such that the threshold voltage distributions corresponding to the states E0, P1, P2, and P3 maintain a predetermined distance therebetween.

During a read operation, the states E0, P1, P2, and P3 may be separated from each other by reference read voltages R1, R2, and R3 included in a reference read voltage set. For example, the reference read voltage R1 may be used to separate memory cells corresponding to the erased state E0 from memory cells corresponding to the first programmed state P1. The reference read voltage R2 may be used to separate the memory cells corresponding to the first programmed state P1 from memory cells corresponding to the second programmed state P2. The reference read voltage R3 may be used to separate the memory cells corresponding to the second programmed state P2 from memory cells corresponding to the third programmed state P3.

Figure 3:
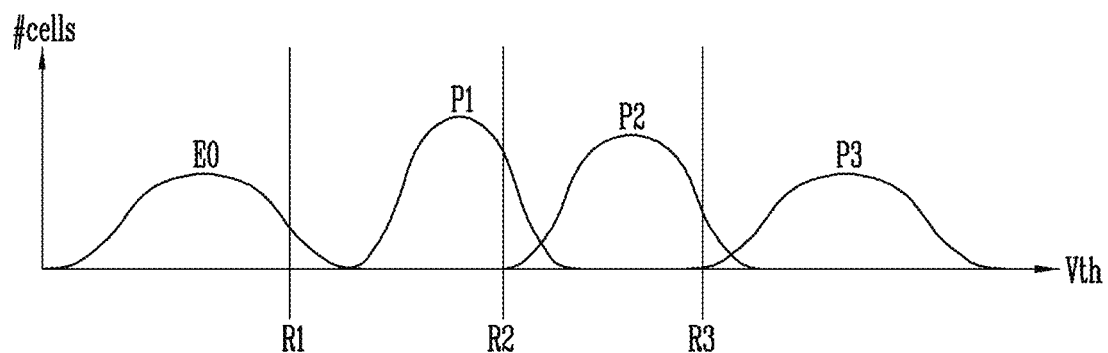
FIG. 3 is a diagram for explaining threshold voltage distributions of memory cells that have changed in channel characteristics.

FIG. 3 is a diagram for explaining threshold voltage distributions of memory cells that have changed in channel characteristics, where the number of cells (#cells) for each program/erase state is plotted as a function of the threshold voltage (Vth).

Changes in the channel characteristics of the memory cells can lead to changes in the threshold voltage distributions corresponding to the states E0, P1, P2, and P3. For example, the channel characteristics such as a program/erase cycle and a retention time can affect the threshold voltage distributions. The program/erase cycle may indicate the number of iterations of program operations and erase operations that have been performed on the memory cells. The retention time may indicate the time elapsed since a program operation was last performed on the memory cells.

Changes in the channel characteristics of the memory cells cause at least one of the threshold voltage distribution curves to be widen or shifted to either the left or the right. For example, the threshold voltage distribution curves corresponding to the states E0, P1, P2, and P3 may shift to the left (indicating smaller threshold voltages) or the right (indicating larger threshold voltages), or the width of at least one of the threshold voltage distributions corresponding to the states E0, P1, P2, and P3 may become different from that of the other threshold voltage distributions.

As a result, the average threshold voltage value of at least one of the threshold voltage distributions may become different from the ideal average threshold voltage value or the standard deviation of at least one of the threshold voltage distributions differs from a standard deviation corresponding to the other threshold voltage distributions. In the context of this patent document, the standard deviation is used to express deviation. Since the standard deviation is the square root of the variance, some embodiments of the disclosed technology can use the variance in lieu of the standard deviation.

As the channel characteristics of the memory cells change, at least some of the threshold voltage distribution curves corresponding to the states E0, P1, P2, and P3 start to shift and/or widen, overlapping with each other. As a result, some of the threshold voltage distribution curve may pass over at least one of reference read voltages. As shown in FIG. 3, due to the changes in channel characteristics, the threshold voltage distribution curve corresponding to the first programmed state P1 overlaps with the threshold voltage distribution curve corresponding to the second programmed state P2, and the threshold voltage distribution curve corresponding to the second programmed state P2 overlaps with the threshold voltage distribution curve corresponding to the third programmed state P3.

In such a situation, reference read voltages R1, R2, and R3 for performing read operations on idea threshold voltage distribution curves may cause read errors, creating a lot of error bits in read data. If the number of error bits included in the read data exceeds the maximum number of correctable bits, an error correction decoding operation may fail.

Therefore, in the case where the channel characteristics of the memory cells are changed, optimum read reference voltages are determined to be used in the read operation on such shifted or distorted threshold voltage distribution curves.

In the context of this patent document, the word "optimum" and "ideal" that are used in conjunction with read reference voltage values or the memory system performance is used to indicate values or conditions that provide a better performance for the memory device (e.g., higher reliability, fewer detected errors, etc.) than existing read reference voltage values or conditions. In this sense, the word optimum may or may not convey the best possible performance achievable by the memory device.

Figure 4:
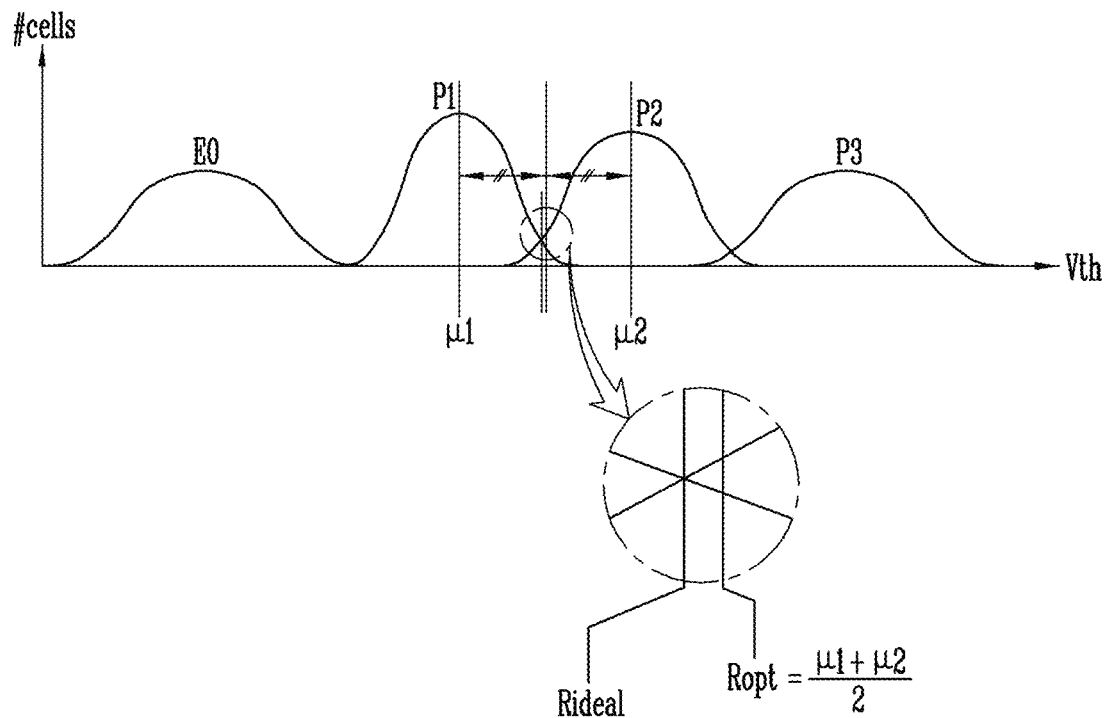
FIG. 4 is a diagram for describing a method of estimating an optimum read voltage based on an embodiment of the disclosed technology.

FIG. 4 is a diagram for describing a method of estimating the optimum read voltage based on an embodiment of the disclosed technology, where the number of cells (#cells) for each program/erase state is plotted as a function of the threshold voltage (Vth).

In the context of this patent document, the word "read voltage" is used to indicate a reference voltage that is applied to a memory cell to determine whether the memory cell is turned on (e.g., data "1") responsive to the reference voltage. The embodiments of the disclosed technology can be used to determine optimum read voltages that can provide a better performance for the memory device by reducing or minimizing read error rates. In determining the optimum read voltages, various "read voltages" are used to obtain various values for use in the equations implemented based on some embodiments of the disclosed technology. As shown in FIG. 4, an optimum read voltage Ropt between the threshold voltage distribution corresponding to the first programmed state P1 and the threshold voltage distribution corresponding to the second programmed state P2 can be determined as discussed below.

An average threshold voltage $\mu_1$ of the threshold voltage distribution corresponding to the first programmed state P1 and an average threshold voltage $\mu_2$ of the threshold voltage distribution corresponding to the second programmed state P2 are estimated, and the optimum read voltage Ropt may be estimated based on the estimated average threshold voltages $\mu_1$ and $\mu_2$. For example, the optimum read voltage Ropt may be estimated as below.

$$Ropt = \frac{\mu 1 + \mu 2}{2} \quad \text{(Eq. 1)}$$

Equation 1 indicates that the optimum read voltage Ropt can be expressed as a median value of the average threshold voltages µ1 and µ2.

If the standard deviations of the threshold voltage distributions corresponding to the programmed states P1 and P2 are equal to each other, the optimum read voltage Ropt calculated by Equation 1 may be effectively used to distinguish the programmed states P1 and P2 from each other.

However, as described above, changes in the channel characteristics of the memory cells cause the standard deviations of the threshold voltage distribution curves to vary from curve to curve. In this case, the optimum read voltage Ropt calculated by Equation 1 may differ from an ideal optimum read voltage Rideal. Therefore, there is a possibility that the number of error bits included in the read data obtained by the optimum read voltage Ropt exceeds the maximum number of correctable error bits.

Therefore, if the standard deviations of the threshold voltage distributions can be accurately estimated, the ideal optimum read voltage Rideal or the optimum read voltage that is close to the ideal optimum read voltage Rideal may be estimated.

FIG. 5 is a diagram for describing a method of estimating a standard deviation and an average threshold voltage based on an embodiment of the disclosed technology.

A first read voltage Ra may be applied to the memory cells, so that read data corresponding to the first read voltage Ra may be obtained. Bit values corresponding to the respective memory cells may be included in the read data. For example, a bit value corresponding to each memory cell having a threshold voltage lower than the first read voltage Ra may be a binary one value "1," and a bit value corresponding to each memory cell having a threshold voltage higher than the first read voltage Ra may be a binary zero value "0." Therefore, if the number of '1' among the bit values included in the read data is calculated, the number of memory cells each having a threshold voltage lower than the first read voltage Ra may be calculated.

In an embodiment, it is assumed that the numbers of memory cells corresponding to the respective states E0, P1, P2, and P3 are equal to each other or known as being equal to each other. In addition, a probability area indicates the portion of the threshold voltage distribution curve that is equal to or greater than the read voltage. In other words, a probability area indicates a right tail portion of the threshold voltage distribution curve on the base of the line that indicates the read voltage. As illustrated in FIG. 5, a first probability area Pa, i.e., a proportion of memory cells each having a threshold voltage equal to or greater than the first read voltage Ra among the memory cells corresponding to the first programmed state P1, may be calculated based on information about the number of memory cells each having a threshold voltage lower than the first read voltage Ra. For example, in the case where the number of memory cells corresponding to each of the states E0, P1, P2, and P3 is 100 and the number of memory cells each having a threshold voltage lower than the first read voltage Ra is 180, the first probability area Pa may be express as below:

$$Pa = \frac{100 + 100 - 180}{100} = 0.2 \quad \text{(Eq. 2)}$$

For example, in the case where data is randomized during a program operation, the numbers of memory cells corresponding to the respective states E0, P1, P2, and P3 may be regarded as being equal to each other.

In an embodiment, in the case where the number of memory cells corresponding to the respective states E0, P1, P2, P3 are known even if the numbers of memory cells corresponding to the respective states E0, P1, P2, and P3 are not equal to each other, the first probability area Pa may be calculated based on the information about the number of memory cells each having a threshold voltage lower than the first read voltage Ra.

A second read voltage Rb may be applied to the memory cells, so that read data corresponding to the second read voltage Rb may be obtained. In the same manner as the case where the first read voltage Ra is applied to the memory cell, a second probability area Pb, i.e., a proportion of memory cells each having a threshold voltage equal to or higher than the second read voltage Rb among the memory cells corresponding to the first programmed state P1, may be calculated.

The first probability area Pa and the second probability area Pb may be represented as Q-functions, as expressed below:

$$Pa = Q\left(\frac{Ra - \mu 1}{\sigma 1}\right) \quad \text{(Eq. 3)}$$

$$Pb = Q\left(\frac{Rb - \mu 1}{\sigma 1}\right) \quad \text{(Eq. 4)}$$

where $R_a$ indicates a first read voltage, $R_b$ indicates a second read voltage, µ1 indicates mean value (mean threshold voltage value) and a1 indicates standard deviation (square root of variance). Here, the Q-function is the tail distribution function of the standard normal distribution.

Equation 5 and Equation 6 below may be obtained by rearranging Equation 3 and Equation 4 for the average threshold voltage µ1.

$$\mu 1 = Ra - Q^{-1}(Pa) \cdot \sigma 1 \quad \text{(Eq. 5)}$$

$$\mu 1 = Rb - Q^{-1}(Pb) \cdot \sigma 1 \quad \text{(Eq. 6)}$$

where $P_a$ indicates a first probability area, Pb indicates a second probability area, $R_a$ indicates the first read voltage, $R_b$ indicates the second read voltage, a1 indicates standard deviation (square root of variance), and $Q^{-1}$ indicates inverse Q-function.

Equation 7 may be obtained by writing Equation 5 and Equation 6 for the standard deviation σ1.

$$\sigma 1 = \frac{Ra - Rb}{Q^{-1}(Pa) - Q^{-1}(Pb)} \quad \text{(Eq. 7)}$$

Since an inverse Q-function ($Q^{-1}$) value is previously known, the standard deviation σ1 of the threshold voltage distribution corresponding to the first programmed state P1 may be obtained by putting an inverse Q-function value corresponding to the first probability area Pa, an inverse Q-function value corresponding to the second probability area Pb, the first read voltage $R_a$, and the second read voltage $R_b$ into Equation 7.

The average threshold voltage µ1 of the threshold voltage distribution corresponding to the first programmed state P1 may be obtained by putting the obtained standard deviation σ1 into Equation 5 or Equation 6.

FIG. 6 is a diagram for describing a method of estimating a standard deviation and an average threshold voltage based on an embodiment of the disclosed technology, where the number of cells (#cells) for each program/erase state is plotted as a function of the threshold voltage (Vth).

In the embodiment described with reference to FIG. 6, it is assumed that the standard deviation σ1 and the average threshold voltage μ1 of the threshold voltage distribution corresponding to the first programmed state P1 are estimated, as described above with reference to FIG. 5.

Referring to FIG. 6, a third read voltage Rc may be applied to the memory cells, so that read data corresponding to the third read voltage Rc may be obtained. A fourth read voltage Rd may be applied to the memory cells, so that read data corresponding to the fourth read voltage Rd may be obtained. In the same manner as the above-described example, the number of memory cells each having a threshold voltage lower than the third read voltage Rc and the number of memory cells each having a threshold voltage lower than the fourth read voltage Rd may be calculated based on the read data. As discussed above, a probability area indicates the portion of the threshold voltage distribution curve that is equal to or greater than the read voltage. A third probability area Pc, i.e., a proportion of memory cells each having a threshold voltage equal to or greater than the third read voltage Rc among the memory cells corresponding to the second programmed state P2, and a fourth probability area Pd, i.e., a proportion of memory cells each having a threshold voltage equal to or greater than the fourth read voltage Rd among the memory cells corresponding to the second programmed state P2, may be calculated based on the calculated number of memory cells.

The third probability area Pc and the fourth probability area Pd may be represented as Q-functions, as expressed below.

$$Pc = Q\left(\frac{Rc - \mu 2}{\sigma 2}\right) \quad \text{(Eq. 8)}$$

$$Pd = Q\left(\frac{Rd - \mu 2}{\sigma 2}\right) \quad \text{(Eq. 9)}$$

Equation 10 and Equation 11 below may be obtained by rearranging Equation 8 and Equation 9 for the average threshold voltage μ2.

$$\mu 2 = Rc - Q^{-1}(Pc) \cdot \sigma 2 \quad \text{(Eq. 10)}$$

$$\mu 2 = Rd - Q^{-1}(Pd) \cdot \sigma 2 \quad \text{(Eq. 11)}$$

Equation 12 may be obtained by writing Equation 10 and Equation 11 for the standard deviation σ2.

$$\sigma 2 = \frac{Rc - Rd}{Q^{-1}(Pc) - Q^{-1}(Pd)} \quad \text{(Eq. 12)}$$

Since an inverse Q-function ($Q^{-1}$) value is previously known, the standard deviation σ2 of the threshold voltage distribution corresponding to the second programmed state P2 may be obtained by putting an inverse Q-function value corresponding to the third probability area Pc, an inverse Q-function value corresponding to the fourth probability area Pd, the third read voltage Rc, and the fourth read voltage Rd into Equation 12.

The average threshold voltage μ2 of the threshold voltage distribution corresponding to the second programmed state P2 may be obtained by putting the obtained standard deviation σ2 into Equation 10 or Equation 11.

Figure 7:
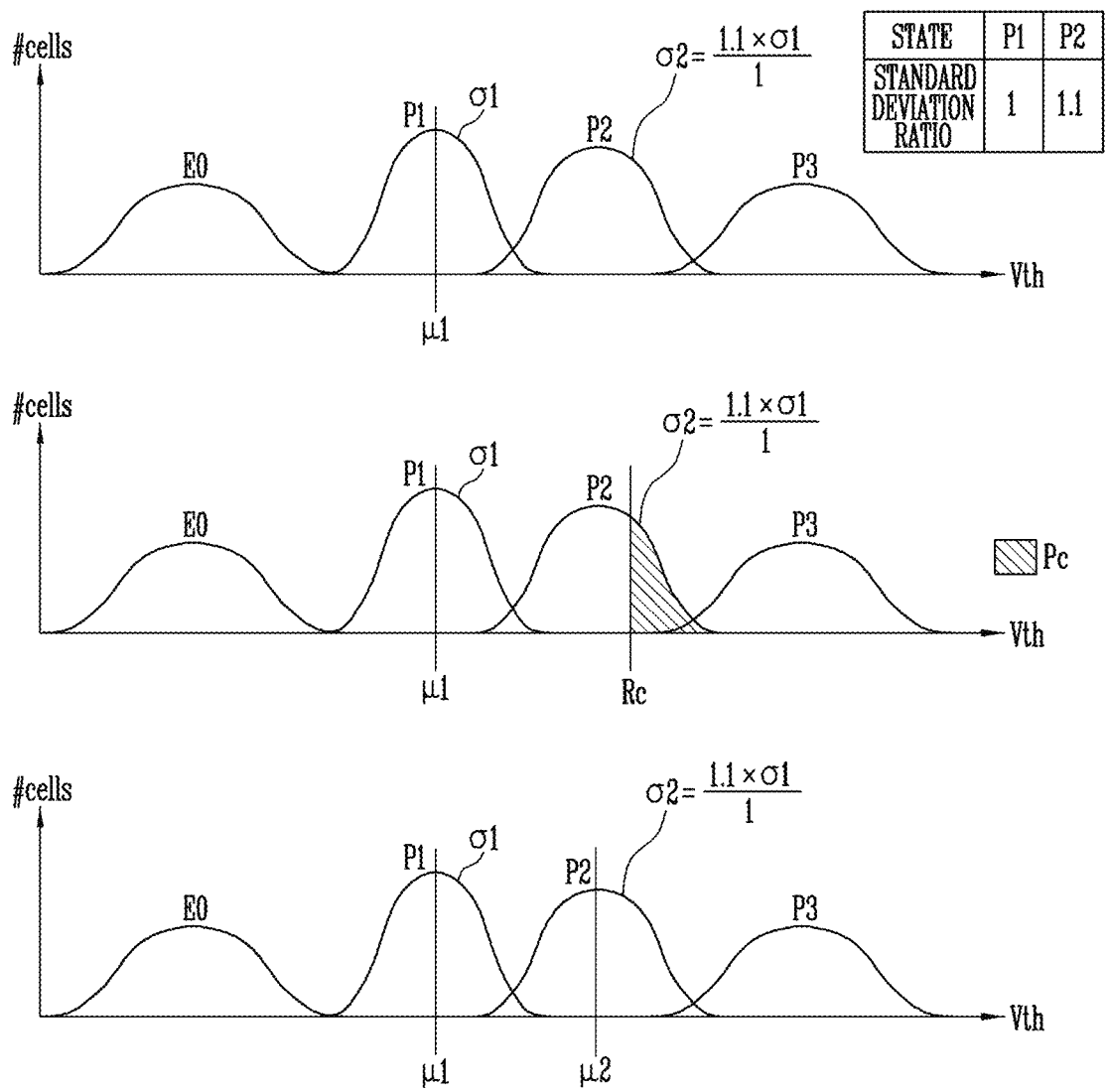
FIG. 7 is a diagram for describing a method of estimating a standard deviation and an average threshold voltage based on an embodiment of the disclosed technology.

FIG. 7 is a diagram for describing a method of estimating a standard deviation and an average threshold voltage based on an embodiment of the disclosed technology, where the number of cells (#cells) for each program/erase state is plotted as a function of the threshold voltage (Vth).

In the embodiment described with reference to FIG. 7, it is assumed that the standard deviation σ1 and the average threshold voltage μ1 of the threshold voltage distribution corresponding to the first programmed state P1 are estimated, as described above with reference to FIG. 5.

A standard deviation of a threshold voltage distribution curve that is adjacent to the threshold voltage distribution curve corresponding to the first programmed state P1 (e.g., the standard deviation σ2 of the threshold voltage distribution corresponding to the second programmed state P2) may be estimated based on a preset standard deviation ratio. Standard deviation ratios between the threshold voltage distributions may be predetermined and listed in a look-up table, as will be discussed below with reference to FIG. 12.

In the case where a ratio of the standard deviation σ2 of the threshold voltage distribution corresponding to the second programmed state P2 to the standard deviation σ1 of the threshold voltage distribution corresponding to the first programmed state P1 is set to 1:1.1, the standard deviation σ2 of the threshold voltage distribution corresponding to the second programmed state P2 may be obtained as below:

$$\sigma 2 = \frac{1.1 \times \sigma 1}{1} \quad \text{(Eq. 13)}$$

The standard deviation σ2 of the threshold voltage distribution corresponding to the second programmed state P2 is calculated based on the preset standard deviation ratio. Hence, in the embodiment illustrated in FIG. 7, the average threshold voltage μ2 of the threshold voltage distribution corresponding to the second programmed state P2 may be estimated through a single read operation using the third read voltage Rc without using the fourth read voltage Rd, unlike the embodiment described with reference to FIG. 6.

To estimate the average threshold voltage μ2, the third read voltage Rc may be applied to the memory cells, so that read data corresponding to the third read voltage Rc may be obtained. As discussed above, a probability area indicates the portion of the threshold voltage distribution curve that is equal to or greater than the read voltage. A third probability area Pc, i.e., a proportion of memory cells each having a threshold voltage equal to or greater than the third read voltage Rc among the memory cells corresponding to the second programmed state P2, may be calculated.

The average threshold voltage μ2 of the threshold voltage distribution corresponding to the second programmed state P2 may be obtained by putting the standard deviation σ2, an inverse Q-function value corresponding to the third probability area Pc, and the third read voltage Rc into Equation 10.

Figure 8:
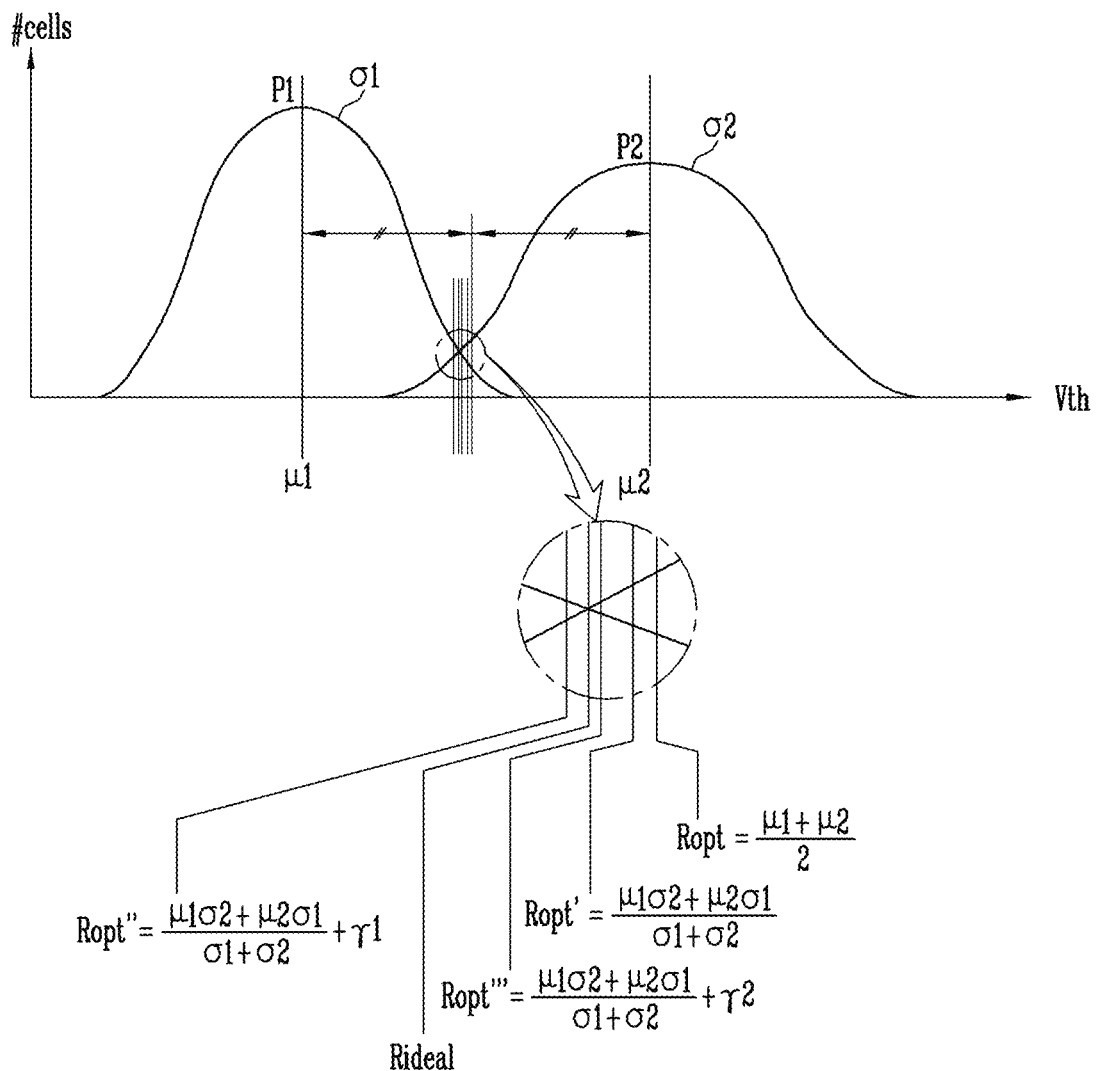
FIG. 8 is a diagram for describing a method of estimating an optimum read voltage based on an embodiment of the disclosed technology.

FIG. 8 is a diagram for describing a method of estimating an optimum read voltage based on an embodiment of the disclosed technology, where the number of cells (#cells) for each program/erase state is plotted as a function of the threshold voltage (Vth).

In the embodiment described with reference to FIG. 8, it is assumed that the standard deviations σ1 and σ2 and the average threshold voltages μ1 and μ2 of the threshold voltage distributions corresponding to the programmed states P1 and P2 are estimated using a method that is identical or similar to the embodiment described with reference to FIGS. 5 and 6 or the embodiment described with reference to FIGS. 5 and 7.

When it is assumed that the threshold voltage distributions corresponding to the programmed states P1 and P2 have Gaussian distribution characteristics, or characteristics approximate to Gaussian distribution, Equation 14 may be obtained:

$$\frac{1}{\sqrt{2\pi}\,\sigma_1} e^{-\frac{(x-\mu_1)^2}{2\sigma_1^2}} = \frac{1}{\sqrt{2\pi}\,\sigma_2} e^{-\frac{(x-\mu_2)^2}{2\sigma_2^2}} \quad \text{(Eq. 14)}$$

In Equation 14, the left side indicates a probability density function corresponding to the first programmed state P1, and the right side indicates a probability density function corresponding to the second programmed state P2.

Equation 14 may be rearranged into Equation 15 and Equation 16.

$$1 = \frac{\sigma_1}{\sigma_2} e^{\frac{(x-\mu_1)^2}{2\sigma_1^2} - \frac{(x-\mu_2)^2}{2\sigma_2^2}} \quad \text{(Eq. 15)}$$

$$0 = \log\frac{\sigma_1}{\sigma_2} + \frac{1}{2\sigma_1^2\sigma_2^2}((\sigma_2^2 - \sigma_1^2)x^2 - 2(\mu_1\sigma_2^2 - \mu_2\sigma_1^2)x + \mu_1^2\sigma_2^2 - \mu_2^2\sigma_1^2) \quad \text{(Eq. 16)}$$

$$\log\frac{\sigma_1}{\sigma_2}$$

In Equation 16, the term may be a relatively very small value.

$$\log\frac{\sigma_1}{\sigma_2}$$

Hence, if the term approximates to zero, Equation 16 may be rearranged into an approximation expression such as Equation 17 or Equation 18.

$$0 \approx \frac{1}{2\sigma_1^2\sigma_2^2}\left(\sigma_2^2(x-\mu_1)^2 - \sigma_1^2(x-\mu_2)^2\right) \quad \text{(Eq. 17)}$$

$$0 \approx \frac{1}{2\sigma_1^2\sigma_2^2}(\sigma_2(x-\mu_1) - \sigma_1(x-\mu_2))\cdot(\sigma_2(x-\mu_1) - \sigma_1(x-\mu_2)) \quad \text{(Eq. 18)}$$

$$\left(\hat{x}_1 = \frac{\mu_1\sigma_2 + \mu_2\sigma_1}{\sigma_1 + \sigma_2}\right)$$

An internally dividing point value and an externally $$\left(\hat{x}_2 = \frac{\mu_1\sigma_2 - \mu_2\sigma_1}{\sigma_1 - \sigma_2}\right)$$

dividing point value may be obtained from Equation 18 above. The internally dividing point value may be used to estimate the optimum read voltage.

In other words, the optimum read voltage Ropt' between the programmed states P1 and P2 may be obtained as below.

$$Ropt' = \frac{\mu_1\sigma_2 + \mu_2\sigma_1}{\sigma_1 + \sigma_2} \quad \text{(Eq. 19)}$$

Referring to FIG. 8, it can be understood that the optimum read voltage Ropt' is more approximate to the ideal optimum read voltage Rideal than is the optimum read voltage Ropt.

$$\log\frac{\sigma_1}{\sigma_2}$$

Although in Equation 16 to Equation 18 the term approximate to zero, it is possible to more accurately estimate the optimum read voltage $$\log\frac{\sigma_1}{\sigma_2}$$

without approximating the term to zero. In the case where the term $$\log\frac{\sigma_1}{\sigma_2}$$

is not approximated to zero, Equation 15 may be rearranged into Equation 20 and Equation 21.

$$1 = e^{\frac{(x-\mu_1)^2}{2\sigma_1^2} - \frac{(x-\mu_2)^2}{2\sigma_2^2} + \log\frac{\sigma_1}{\sigma_2}} \quad \text{(Eq. 20)}$$

$$\frac{(x-\mu_1)^2}{2\sigma_1^2} - \frac{(x-\mu_2)^2}{2\sigma_2^2} + \log\frac{\sigma_1}{\sigma_2} = 0 \quad \text{(Eq. 21)}$$

$$A = \frac{1}{2\sigma_1^2}, \ B = \frac{1}{2\sigma_2^2}, \ C = \log\frac{\sigma_1}{\sigma_2},$$

Here, when it is satisfied that Equation 21 above may be rearranged into Equation 22 to Equation 26 below.

$$A(x-\mu_1)^2 - B(x-\mu_2)^2 + C = 0 \quad \text{(Eq. 22)}$$

$$(A-B)x^2 - 2(A\mu_2 - B\mu_2)x + A\mu_1^2 - B\mu_2^2 + C = 0 \quad \text{(Eq. 23)}$$

$$x = \frac{(A\mu_1 - B\mu_2) + \sqrt{(A\mu_1 - B\mu_2)^2 - (A-B)(A\mu_1^2 - B\mu_2^2 + C)}}{(A-B)} \quad \text{(Eq. 24)}$$

$$x = \frac{(A\mu_1 - B\mu_2) + \sqrt{AB(\mu_1 - \mu_2)^2 - C(A-B)}}{(A-B)} \quad \text{(Eq. 25)}$$

$$x = \frac{(A\mu_1 - B\mu_2) - \sqrt{AB}(\mu_1 - \mu_2)\sqrt{1 - \frac{C(A-B)}{AB(\mu_1-\mu_2)^2}}}{(A-B)} \quad \text{(Eq. 26)}$$

Since Equation 26 does not use approximation, a solution of Equation 26 may be used to estimate the accurate optimum read voltage.

A Taylor series expansion of $\sqrt{1+z}$ may be represented as Equation 27.

$$\sqrt{1+z} = 1 + \tfrac{1}{2}z - \tfrac{1}{8}z^2 + \tfrac{1}{16}z^3 - \tfrac{5}{128}z^4 + \tfrac{7}{256}z^5 \quad \text{(Eq. 27)}$$

If $$\sqrt{1 - \frac{C(A-B)}{AB(\mu_1-\mu_2)^2}}$$

of Equation 26 is expanded in Taylor series to have only the primary term, Equation 26 may be rearranged into Equation 28 to Equation 30 as expressed below:

$$x \approx \frac{(A\mu_1 - B\mu_2) - \sqrt{AB}(\mu_1-\mu_2) + \tfrac{1}{2} \cdot \frac{C(A-B)}{\sqrt{AB}(\mu_1-\mu_2)}}{(A-B)} \quad \text{(Eq. 28)}$$

$$x \approx \frac{\sqrt{A}\mu_1(\sqrt{A} - \sqrt{B}) + \sqrt{B}\mu_2(\sqrt{A} - \sqrt{B})}{A-B} + \tfrac{1}{2} \cdot \frac{C}{\sqrt{AB}(\mu_1-\mu_2)} \quad \text{(Eq. 29)}$$

$$x \approx \frac{\sqrt{A}\mu_1 + \sqrt{B}\mu_2}{\sqrt{A}+\sqrt{B}} + \tfrac{1}{2} \cdot \frac{C}{\sqrt{AB}(\mu_1-\mu_2)} \quad \text{(Eq. 30)}$$

Since in the foregoing description it is written that $$A = \frac{1}{2\sigma_1^2}, B = \frac{1}{2\sigma_2^2}, C = \log\frac{\sigma_1}{\sigma_2},$$

Equation 30 may be rearranged into Equation 31.

$$x \approx \frac{\mu_1\sigma_2 + \mu_2\sigma_1}{\sigma_1+\sigma_2} + \log\frac{\sigma_1}{\sigma_2} \cdot \frac{\sigma_1\sigma_2}{(\mu_1-\mu_2)} \quad \text{(Eq. 31)}$$

In the case where Equation 31 is used to estimate the optimum read voltage, the optimum read voltage Ropt" between the programmed states P1 and P2 may be estimated by Equation 32.

$$Ropt'' = \frac{\mu_1\sigma_2 + \mu_2\sigma_1}{\sigma_1+\sigma_2} + \gamma 1 \quad \text{(Eq. 32)}$$

The offset value γ1 of Equation 32 may indicate $$\log\frac{\sigma_1}{\sigma_2} \cdot \frac{\sigma_1\sigma_2}{(\mu_1-\mu_2)}.$$

Referring to FIG. 8, it can be understood that the optimum read voltage Ropt" that is estimated by the Taylor series expansion to the primary term is approximate more closely to the ideal optimum read voltage Rideal than is the optimum read voltage Ropt'.

If $$\sqrt{1 - \frac{C(A-B)}{AB(\mu_1-\mu_2)^2}}$$

of Equation 26 is expanded in Taylor series to have the higher-order terms, the optimum read voltage may be more accurately estimated.

If $$\sqrt{1 - \frac{C(A-B)}{AB(\mu_1-\mu_2)^2}}$$

of Equation 26 is expanded in Taylor series to have the secondary terms, Equation 26 may be rearranged into Equation 33.

$$x \approx \frac{\mu_1\sigma_2 + \mu_2\sigma_1}{\sigma_1+\sigma_2} + \log\frac{\sigma_1}{\sigma_2} \cdot \frac{\sigma_1\sigma_2}{(\mu_1-\mu_2)} + \tfrac{1}{2} \cdot \left(\log\frac{\sigma_1}{\sigma_2}\right)^2 \cdot \frac{\sigma_1\sigma_2(\sigma_2^2-\sigma_1^2)}{(\mu_1-\mu_2)^2} \quad \text{(Eq. 33)}$$

In the case where Equation 33 is used to estimate the optimum read voltage, the optimum read voltage Ropt''' between the programmed states P1 and P2 may be estimated by Equation 34 below:

$$Ropt''' = \frac{\mu_1\sigma_2 + \mu_2\sigma_1}{\sigma_1+\sigma_2} + \gamma 2 \quad \text{(Eq. 34)}$$

The offset value of Equation 34 may indicate $$\log\frac{\sigma_1}{\sigma_2} \cdot \frac{\sigma_1\sigma_2}{(\mu_1-\mu_2)} + \tfrac{1}{2} \cdot \left(\log\frac{\sigma_1}{\sigma_2}\right)^2 \cdot \frac{\sigma_1\sigma_2(\sigma_2^2-\sigma_1^2)}{(\mu_1-\mu_2)^2}.$$

Referring to FIG. 8, it can be understood that the optimum read voltage Ropt''' that is estimated by the Taylor series expansion to the secondary term is approximate more closely to the ideal optimum read voltage Rideal than is the optimum read voltage Ropt" that is estimated by the Taylor series expansion to the primary term.

Although the method of estimating the optimum read voltage by the Taylor series expansion to the primary term or the secondary term has been described above, embodiments of the disclosed technology are not limited to thereto. For example, the optimum read voltage may be estimated by the Taylor series expansion to the n-order term (n is a natural number).

The optimum read voltage may be accurately estimated using the solution of Equation 26 that does not use the approximation, as described above. In this case, the offset value $\gamma 3$ may be calculated by Equation 26 and Equation 29.

For example, the Equation 26 may be expressed as Equation 35 below:

$$x = \frac{(A\mu_1 - B\mu_2) - \sqrt{AB}(\mu_1 - \mu_2) + \sqrt{AB}(\mu_1 - \mu_2) - \sqrt{AB}(\mu_1 - \mu_2)\sqrt{1 - \frac{C(A-B)}{AB(\mu_1 - \mu_2)^2}}}{(A-B)} \quad \text{(Eq. 35)}$$

Here, the term $$\frac{1}{2} \cdot \frac{C}{\sqrt{AB}(\mu_1 - \mu_2)}$$

of Equation 29 corresponds to the approximated offset value $\gamma 1$. Therefore, if the term $$\frac{\sqrt{A}\mu_1(\sqrt{A} - \sqrt{B}) + \sqrt{B}\mu_2(\sqrt{A} - \sqrt{B})}{A-B}$$

except the term $$\frac{1}{2} \cdot \frac{C}{\sqrt{AB}(\mu_1 - \mu_2)}$$

among the right-side terms of Equation 29 is subtracted from the right side of Equation 35, a non-approximated accurate offset value $\gamma 3$ may be calculated by Equation 36.

$$\gamma 3 = \frac{\sqrt{AB}(\mu_1 - \mu_2) - \sqrt{AB}(\mu_1 - \mu_2)\sqrt{1 - \frac{C(A-B)}{AB(\mu_1 - \mu_2)^2}}}{(A-B)} \quad \text{(Eq. 36)}$$

In the case where Equation 26 and Equation 36 are used to estimate the optimum read voltage, the optimum read voltage Ropt'''' between the programmed states P1 and P2 may be estimated by Equation 37.

$$Ropt'''' = \frac{\mu_1 \sigma_2 + \mu_2 \sigma_1}{\sigma_1 + \sigma_2} + \gamma 3 \quad \text{(Eq. 37)}$$

Figure 9:
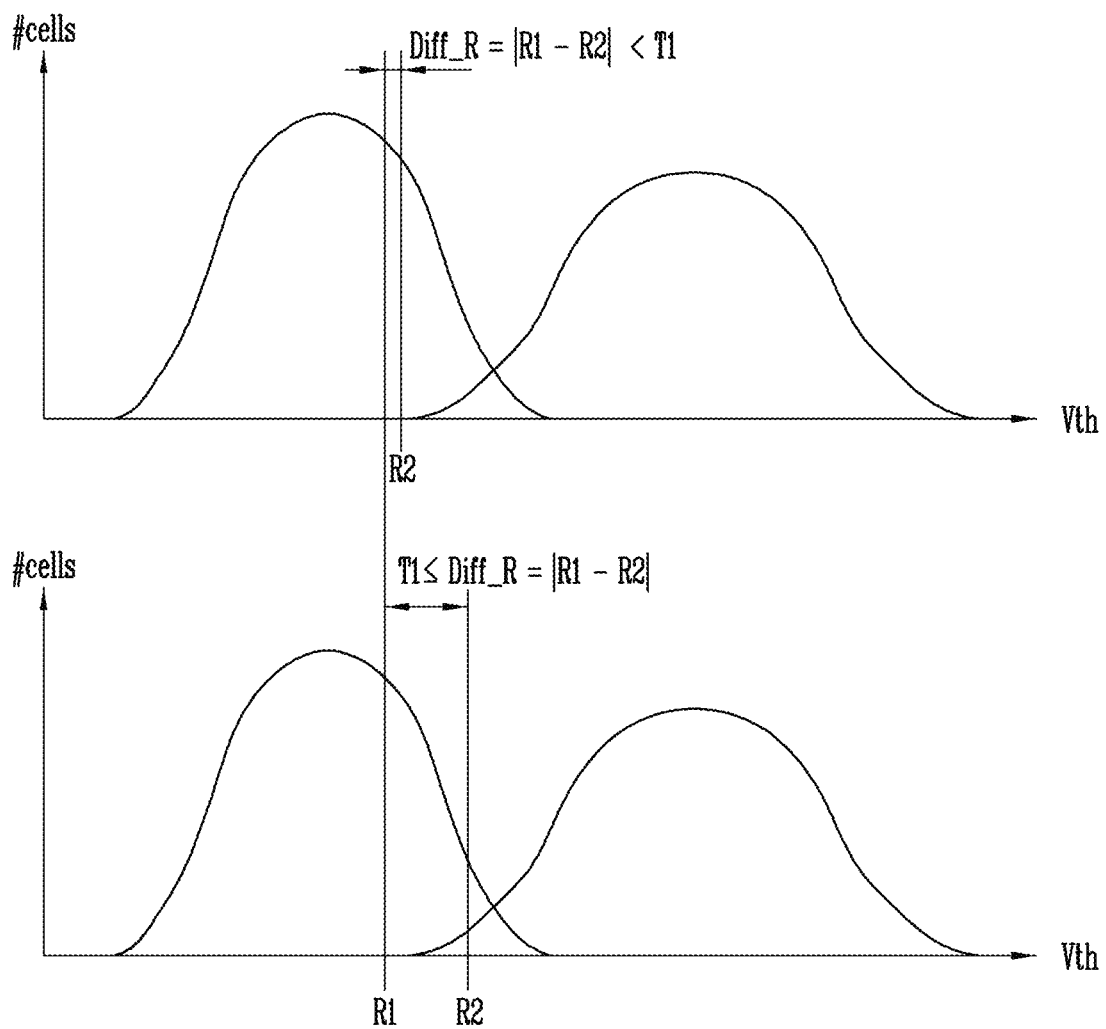
Figure 10:
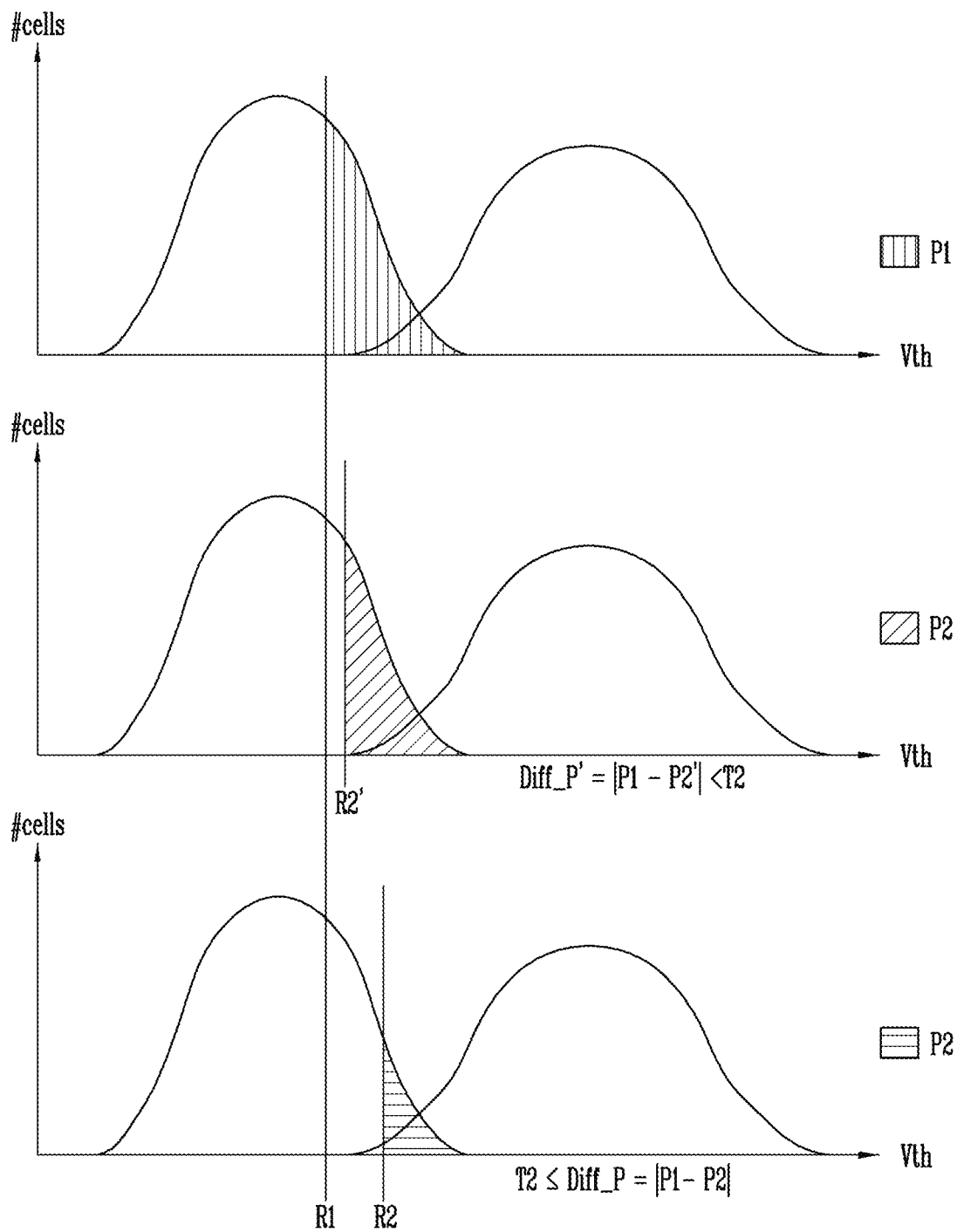

FIGS. 9 to 11 are diagrams for describing a method of determining a target read voltage based on an embodiment of the disclosed technology, where the number of cells (#cells) for each program/erase state is plotted as a function of the threshold voltage (Vth).

The embodiments of the disclosed technology can be used to determine optimum read voltages that can provide a better performance for the memory device by reducing or minimizing read error rates. In determining the optimum read voltages, various read voltages are used to obtain various values for use in the equations for determining optimum read voltages based on some embodiments of the disclosed technology. Such read voltages may include target read voltages as will be discussed below.

In the case where two target read voltages are used to estimate an average threshold voltage of a threshold voltage distribution, the target read voltages may be selected within a range satisfying at least one of first to third conditions. Target read voltages R1, R1', R2, and R2' described with reference to FIGS. 9 to 11 may include at least one of the read voltages Ra, Rb, Rc, and Rd described with reference to FIGS. 5 to 7.

The first condition may indicate that a difference value Diff_R between the target read voltages R1 and R2 which are used to estimate a standard deviation of the same threshold voltage distribution may be equal to or greater than a first threshold value T1. For example, as illustrated in FIG. 9, if the difference value Diff_R between the target read voltages R1 and R2 is excessively small or the target read voltages R1 and R2 are equal to each other, the standard deviation may not be accurately estimated. Therefore, to accurately estimate the standard deviation, the target read voltages R1 and R2 satisfying the first condition are selected. For example, the first condition may be expressed as Equation 38 below:

$$T1 \leq |R1 - R2| \quad \text{(Eq. 38)}$$

Here, the first threshold value T1 may be arbitrarily or experimentally determined.

The second condition indicates that a difference value Diff_P between the probability areas P1 and P2 respectively corresponding to the target read voltages R1 and R2 that are used to estimate a standard deviation of the same threshold voltage distribution must be equal to or greater than a second threshold value T2 or more. For example, as illustrated in FIG. 10, if a difference value Diff_P between the probability areas P1 and P2' calculated based on the target read voltages R1 and R2' is excessively small or the probability areas P1 and P2' are equal to each other, the standard deviation may not be accurately estimated. Therefore, in the case where the probability areas P1 and P2' calculated based on the target read voltages R1 and R2' do not satisfy the second condition, the target read voltages R1 and R2 may be re-selected until the probability areas P1 and P2 satisfying the second condition are obtained. For example, the second condition may be expressed as Equation 39 below:

$$T2 \leq |P1 - P2| \quad \text{(Eq. 39)}$$

Here, the second threshold value T2 may be arbitrarily or experimentally determined.

The third condition indicates that the probability areas P1 and P2 respectively corresponding to the target read voltages R1 and R2 that are used to estimate a standard deviation of the same threshold voltage distribution must be equal to or greater than a third threshold value T3 and less than a fourth threshold value 1−T3. For example, as illustrated in FIG. 11, the words "the probability area P1' calculated based on the target read voltage R1' is excessively small or excessively large" may indicate that the target read voltage R1' is at a tail of the threshold voltage distribution curve. Since many erroneous bits occur at the tail of the threshold voltage distribution curve, the third condition may function to prevent the target read voltage R1 from being at the tail of the threshold voltage distribution curve. Therefore, in the case where the probability area P1' calculated based on the target read voltage R2' does not satisfy the second condition, the target read voltage R1 may be selected until the probability area P1 satisfying the third condition is obtained. The same principle may also be applied to the target read voltage R2. For example, the third condition may be expressed as Equation 40 below:

$$T3 \leq P1, P2 < 1-T3 \quad \text{(Eq. 40)}$$

Here, the third threshold value T3 may be arbitrarily or experimentally determined.

In the case where a standard deviation ratio and one target read voltage are used to estimate an average threshold voltage of the threshold voltage distribution, the target read voltage may be selected within a range satisfying a fourth condition. The fourth condition indicates that, in the same manner as the third condition, the probability area P1 corresponding to the target read voltage R1 is equal to or greater than a fifth threshold value T5 and less than a sixth threshold voltage 1−T5. In the same manner as the third condition, the fourth condition may function to prevent the target read voltage R1 from being at a tail of the threshold voltage distribution. In the case where the probability area P1' calculated based on the target read voltage R1' does not satisfy the fourth condition, the target read voltage R1 may be selected until the probability area P1 satisfying the fourth condition is obtained. For example, the fourth condition may be expressed as Equation 41 below:

$$T5 \leq P1 < 1-T5 \quad \text{(Eq. 41)}$$

Here, the fifth threshold value T5 may be arbitrarily or experimentally determined and be equal to or different from the third threshold voltage T3.

FIG. 12 is a diagram for describing a first table based on an embodiment of the disclosed technology.

The first table (look-up table) may include standard deviation ratios between threshold voltage distributions corresponding to respective states. The values in the first table may be experimentally obtained. For example, the values in the first table may be obtained by calculating standard deviations of the threshold voltage distributions corresponding to the respective states with changes in channel characteristics of test memory cells and calculating ratios between the calculated standard deviations.

Although the channel characteristics may include at least one of a program/erase cycle P/E and a retention time R/T, embodiments of the disclosed technology are not limited thereto.

For example, FIG. 12 illustrates an example of the first table including standard deviation ratios between threshold voltage distributions according to the program/erase cycle P/E and the retention time R/T. Furthermore, FIG. 12 illustrates an example of the first table including standard deviation ratios between the threshold voltage distributions corresponding to states that can be included in 3-bit multi-level cells (MLCs), i.e., triple-level cells (TLCs). The 3-bit MLCs may include any one state of an erased state E0 and seven programmed states P1 to P7.

As described with reference to FIG. 7, when a standard deviation corresponds to a desired programmed state using a standard deviation ratio, the first table may be used. Here, a standard deviation ratio corresponding to channel characteristics of target memory cells may be selected from the first table. In this way, an optimum read voltage may be estimated based on the channel characteristics of the target memory cells.

FIG. 13 is a diagram for describing a second table based on an embodiment of the disclosed technology.

In the case where Equation 19 is used to estimate the optimum read voltage Ropt, a large amount of resources may need to be occupied to perform mathematical operations such as division operations.

If the term $$\frac{\sigma_2}{\sigma_1 + \sigma_2}$$

of Equation 19 is replaced with α and the term $$\frac{\sigma_2}{\sigma_1 + \sigma_2}$$

is replaced with β, the optimum read voltage Ropt'''' may be estimated by Equation 42.

$$Ropt'''' = \alpha \cdot \mu_1 + \beta \cdot \mu_2 \quad \text{(Eq. 42)}$$

If weighted values α and β are previously defined, a division operation is not needed. Therefore, resource consumption may be reduced in estimating the optimum read voltage Ropt''''.

The weighted values α and β may be predetermined based on the channel characteristics. Although the channel characteristics may include at least one of a program/erase cycle P/E and a retention time R/T, embodiments of the disclosed technology are not limited thereto.

FIG. 13 illustrates a second table including weighted values $\alpha_{11}$, $\beta_{11}$ to $\alpha_{74}$, $\beta_{74}$ as examples of the weighted values α and β. The second table may include weighted values $\alpha_{11}$, $\beta_{11}$ to $\alpha_{74}$, $\beta_{74}$ which are used to estimate an optimum read voltage between threshold voltage distributions corresponding to adjacent states. For example, standard deviations of the threshold voltage distributions corresponding to the respective states may be calculated with changes in channel characteristics of test memory cells, and the second table may include the weighted values $\alpha_{11}$, $\beta_{11}$ to $\alpha_{74}$, $\beta_{74}$ obtained based on the calculated standard deviations.

The second table may be more effectively used to estimate an optimum read voltage between threshold voltage distributions of which standard deviations are changed similarly to each other even if the channel characteristics are changed. For example, referring to the standard deviation ratios of the first table illustrated in FIG. 12, it may be deduced that the standard deviations of the programmed states P1 to P6 are changed similarly to each other. In the case where the standard deviations of the threshold voltage distributions adjacent to each other are changed similarly to each other, the weighted values $\alpha_{11}$, $\beta_{11}$ to $\alpha_{74}$, $\beta_{74}$ defined in the second table may be similar to weighted values calculated based on current estimated standard deviations. Therefore, Equation 42 may be effectively used to estimate the optimum read voltage between the adjacent threshold voltage distributions of which the standard deviations are changed similarly to each other.

FIG. 14 is a diagram for describing a third table based on an embodiment of the disclosed technology.

In the case where Equation 32 is used to estimate the optimum read voltage Ropt", a division operation may be needed to calculate the offset value γ1. In the case where Equation 34 is used to estimate the optimum read voltage Ropt'", a division operation may be needed to calculate the offset value γ1. In the case where Equation 37 is used to estimate the optimum read voltage Ropt"", a division operation may be needed to calculate the offset value γ2. A lot of resources may be consumed to perform the division operations.

If a predefined offset value γ can be used, a separate division operation is not needed. Hence, resource consumption may be reduced. In the case where the predefined offset value Y is used, an optimum read voltage Ropt""' may be estimated by Equation 43.

If the term $$\frac{\sigma_2}{\sigma_1 + \sigma_2}$$

of Equation 32, Equation 34, or Equation 37 is replaced with α and the term $$\frac{\sigma_1}{\sigma_1 + \sigma_2}$$

is replaced with β, the optimum read voltage Ropt""' may be estimated by Equation 43 below:

$$Ropt = \alpha \cdot \mu 1 \beta \cdot \mu 2 + \gamma \quad \text{(Eq. 43)}$$

In Equation 43, α may be $$\frac{\sigma_2}{\sigma_1 + \sigma_2},$$

β may be $$\frac{\sigma_1}{\sigma_1 + \sigma_2},$$

and the offset value γ may be any one of the offset values γ1, γγ2, γ3 predetermined for the test memory cells.

FIG. 14 illustrates a third table including offset values $\gamma_{11}$, to $\gamma_{74}$ as examples of the offset value γ. The third table may include the offset values to $\gamma_{74}$ which are used to estimate an optimum read voltage between threshold voltage distributions corresponding to adjacent states.

For example, standard threshold voltages and standard deviations of the threshold voltage distributions corresponding to the states E0 to P7 may be calculated with changes in channel characteristics of the test memory cells, and the third table may include the offset values $\gamma_{11}$ to $\gamma_{74}$ obtained based on the calculated standard deviations and standard threshold voltages.

The predetermined offset values $\gamma_{11}$ to $\gamma_{74}$ included in the third table may be values obtained based on some of the channel characteristics of the memory cells. Therefore, in the case where the offset values $\gamma_{11}$ to $\gamma_{74}$ are used, the optimum read voltage Ropt""' that is closer to the ideal optimum read voltage than is the optimum read voltage Ropt""' calculated by Equation 42 may be estimated.

Figure 15:
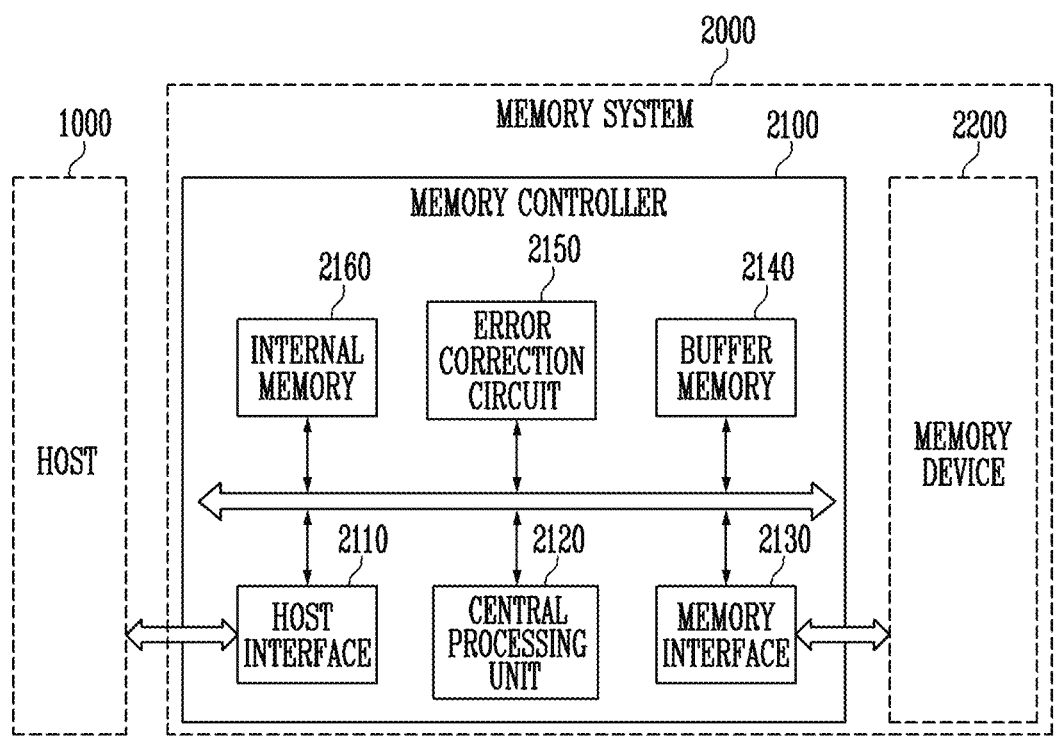
FIG. 15 is a diagram for explaining a memory controller illustrated in FIG. 1.

FIG. 15 is a diagram for explaining a memory controller 2100 illustrated in FIG. 1.

Referring to FIG. 15, the memory controller 2100 based on an embodiment of the disclosed technology may include a host interface 2110, a central processing unit 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the central processing unit 2120.

The host interface 2110 may perform communication with the host 1000 using various interface protocols. For example, the host interface 2110 may communicate with the host 1000 using at least one of various interface protocols such as a non-volatile memory express (NVMe) protocol, a peripheral component interconnection-express (PCI-E) protocol, an advanced technology attachment (ATA) protocol, a serial ATA (SATA) protocol, a parallel ATA (PATA) protocol, a universal serial bus (USB) protocol, a multimedia card (MMC) protocol, an enhanced small disk interface (ESDI) protocol, an integrated drive electronics (IDE) protocol, a mobile industry processor interface (MIPI) protocol, a universal flash storage (UFS) protocol, a small computer system interface (SCSI) protocol, and a serial attached SCSI (SAS) protocol. However, embodiments of the disclosed technology are not limited to this.

The central processing unit 2120 may perform various operations or generate a command and an address so as to control the memory device 2200. For example, the central processing unit 2120 may generate various commands and addresses required for a program operation, a read operation, or an erase operation in response to a request from the host 1000, and output the generated commands and addresses to the memory device 2200.

In an embodiment, when the central processing unit 2120 autonomously determines that there is a need to perform a read operation, for example, when it is determined that a read operation is needed to estimate the optimum read voltage, the central processing unit 2120 may generate a command and an address required for the read operation and transmit the command and the address to the memory device 2200.

The central processing unit 2120 may translate a logical address included in the request received from the host 1000 to a physical address so as to control the operation of the memory device 2200. The central processing unit 2120 may use the address mapping table stored in the internal memory 2160 to translate a logical address to a physical address or translate a physical address to a logical address. The central processing unit 2120 may update the address mapping table when new data is programmed to the memory device 2200 or data that has been stored in the memory device 2200 is erased.

In an embodiment, the central processing unit 2120 may randomize data during a program operation, and derandomize the data during a read operation. In the context of this patent document, the term "randomization" may indicate converting bit values so that the number of bit value 0s and the number of bit value 1s are similar to each other. For example, in the case where the number of bit value 0s included in 8-bit data is two and the number of bit value 1s is six, the number of bit value 0s and the number of bit value 1s may become similar to each other by converting some of bit value 1s to bit value 0s. For example, the central processing unit 2120 may generate randomized data by operating data to be programmed and seed data. The central processing unit 2120 may manage index information about bit values converted during the randomization process. During a read operation, the central processing unit 2120 may re-convert some of the bit values included in read data, with reference to the index information that the central processing unit 2120 manages.

In an embodiment, during the program operation, the central processing unit 2120 may calculate the number of memory cells corresponding to each of the threshold voltage distributions, and manage the number of memory cells. For example, the central processing unit 2120 may calculate the number of memory cells corresponding to each of the threshold voltage distributions by checking bit values included in data to be programmed. For instance, in the case where data is programmed to a 2-bit MLC area, the central processing unit 2120 may calculate the number of memory cells in which most significant bit (MSB)-least significant bit (LSB) is to be programmed to '11' as the number of memory cells corresponding a threshold voltage distribution corresponding to an erased state EU. In addition, the central processing unit 2120 may calculate the number of memory cells in which MSB-LSB is to be programmed to '01' as the number of memory cells corresponding a threshold voltage distribution corresponding to a first programmed state P1. Also, the central processing unit 2120 may calculate the number of memory cells in which MSB-LSB is to be programmed to '00' as the number of memory cells corresponding a threshold voltage distribution corresponding to a second programmed state P2. Furthermore, the central processing unit 2120 may calculate the number of memory cells in which MSB-LSB is to be programmed to '10' as the number of memory cells corresponding a threshold voltage distribution corresponding to a third programmed state P3.

In an embodiment in which randomization is performed on data during a program operation, the central processing unit 2120 may not manage the number of memory cells corresponding to each of the threshold voltage distributions. In the case where the randomization for the data is not performed, the number of memory cells corresponding to each of the threshold voltage distributions corresponding to the states may be regarded as being the same as the others.

In an embodiment, the central processing unit 2120 may perform the program operation using an incremental step pulse programming (ISPP) method. The central processing unit 2120 may perform the program operation such that threshold voltage distributions corresponding to the memory cells have Gaussian distribution characteristics, or characteristics approximate to Gaussian distribution.

In an embodiment, the central processing unit 2120 may manage channel characteristics corresponding to a storage area including memory cells. For example, the channel characteristics may correspond to at least one of a program/erase cycle or a retention time. For example, the storage area may correspond to one page, one memory block, one plane or one die.

In an embodiment, during a read operation, the central processing unit 2120 may perform a read operation on the memory cells using a reference read voltage set. In the case where the error correction circuit 2150 notifies the central processing unit 2120 that an error correction decoding operation on read data using the reference read voltage set has failed, the central processing unit 2120 may perform an operation of determining an optimum read voltage corresponding to a target storage area.

In an embodiment, the central processing unit 2120 may estimate an optimum read voltage between first and second threshold voltage distributions, based on average threshold voltages and standard deviations of the first and second threshold voltage distributions and probability density functions corresponding to the first and second threshold voltage distributions.

In an embodiment, the central processing unit 2120 may calculate a standard deviation of the first threshold voltage distribution, based on a first probability area of a first section distribution distinguished by a first target read voltage in the first threshold voltage distribution, a second probability area of a second section distribution distinguished by a second target read voltage in the first threshold voltage distribution, and inverse Q-function values respectively corresponding to the first and second probability areas.

In an embodiment, the central processing unit 2120 may calculate the first and second probability areas based on received read data corresponding to the first and second target read voltages. For example, the central processing unit 2120 may calculate the first and second probability areas by comparing the number of memory cells that are managed to correspond to each of a plurality of threshold voltage distributions that the memory cells included in the target storage area may have, with the number of first bit values (e.g., 1s) among bit values included in the read data received in response to each of the first and second target read voltages.

In an embodiment, the central processing unit 2120 may calculate a standard deviation of the first threshold voltage distribution, based on a difference value between the first and second target read voltages and a difference value between the inverse Q-function values respectively corresponding to the first and second probability areas.

In an embodiment, the central processing unit 2120 may calculate an average threshold voltage of the first threshold voltage distribution, based on an inverse Q-function corresponding to any one of the first and second probability areas and a standard deviation of the first threshold voltage distribution.

In an embodiment, the central processing unit 2120 may estimate a standard deviation and an average threshold voltage of the second threshold voltage distribution, in the same principle as that of the operation of estimating the standard deviation and the average threshold voltage of the first threshold voltage distribution. Third and fourth target read voltages may be used to estimate the standard deviation and the average threshold voltage of the second threshold voltage distribution.

In an embodiment, the central processing unit 2120 may determine first to fourth target read voltages such that at least one of the above-mentioned first to third conditions is satisfied. The central processing unit 2120 may redetermine the first to fourth target read voltages when at least one of the above-mentioned first to third conditions is not satisfied.

In an embodiment, the central processing unit 2120 may set a read voltage period such that a standard deviation and an average threshold voltage of at least one of the first and second threshold voltage distributions may be estimated, and determine at least one of the first to fourth target read voltages within the set read voltage period. The central processing unit 2120 may determine at least one of the first to fourth target read voltages with reference to a preset standard deviation value. The central processing unit 2120 may manage, in correspondence with target storage areas, one arbitrary standard deviation value or a plurality of arbitrary standard deviation values respectively corresponding to a plurality of states. The central processing unit 2120 may determine at least one of the first to fourth target read voltages based on the arbitrary standard deviation value that is being managed. For example, in the case where the arbitrary standard deviation value is sufficiently large, the central processing unit may determine the first and second target read voltages such that a difference value between the first and second read voltages or a difference value between the third and fourth target read voltages is sufficiently large. In the case where an error correction decoding operation on read data corresponding to the optimum read voltage passes, the arbitrary standard deviation value may be updated to a standard deviation value obtained during an operation of estimating the optimum read voltage.

In an embodiment, the central processing unit 2120 may calculate a standard deviation of the second threshold voltage distribution based on the preset standard deviation ratio and the standard deviation of the first threshold voltage distribution in response to the channel characteristics of the memory cells. Here, the central processing unit 2120 may calculate an average threshold voltage of the second threshold voltage distribution, based on the standard deviation of the second threshold voltage distribution and an inverse Q-function value corresponding to a third probability area of a third section distribution distinguished by a third target read voltage in the second threshold voltage distribution. The central processing unit 2120 may determine the third target read voltage to be applied to the memory cells such that the above-mentioned fourth condition is satisfied. The central processing unit 2120 may redetermine the third target read voltage if the above-mentioned fourth condition is not satisfied.

In an embodiment, the central processing unit 2120 may estimate the optimum read voltage between the first and second threshold voltage distributions based on an equation between probability density functions corresponding to the first and second threshold voltage distributions.

In an embodiment, the central processing unit 2120 may estimate the optimum read voltage between the first and second threshold voltage distributions based on a solution of the equation between the probability density functions corresponding to the first and second threshold voltage distributions. The solution of the equation may be expressed as an average threshold voltage of the first threshold voltage distribution, a first weight corresponding to the average threshold voltage of the first threshold voltage distribution, an average threshold voltage of the second threshold voltage distribution, a second weight corresponding to the average threshold voltage of the second threshold voltage distribution, and an offset value.

In an embodiment, the central processing unit 2120 may estimate the optimum read voltage using a solution of an approximation expression obtained by approximating the equation between the probability density functions corresponding to the first and second threshold voltage distributions. The solution of the approximation expression may be expressed as the average threshold voltage of the first threshold voltage distribution, the first weight corresponding to the average threshold voltage of the first threshold voltage distribution, the average threshold voltage of the second threshold voltage distribution, and the second weight corresponding to the average threshold voltage of the second threshold voltage distribution. In an embodiment, the solution of the approximation expression may further include an offset value.

In an embodiment, the central processing unit 2120 may manage at least one of the weight or the offset value included in the equation or the approximation expression in response to the channel characteristics of the memory cells, and estimate the optimum read voltage by applying the weight or the offset value that is managed by the central processing unit 2120.

In an embodiment, the central processing unit 2120 may perform a read operation on the memory cells included in the target storage area using the estimated optimum read voltage. In the case where the error correction circuit 2150 notifies the central processing unit 2120 that the error correction decoding operation on the read data corresponding to the estimated optimum read voltage has passed, the central processing unit 2120 may include the estimated optimum read voltage in the reference read voltage set.

The memory interface 2130 may communicate with the memory device 2200 using various interface protocols.

The buffer memory 2140 may temporarily store data while the memory controller 2100 controls the memory device 2200. For example, program data received from the host 1000 may be temporarily stored in the buffer memory 2140 until the program operation is completed. Furthermore, data read from the memory device 2200 during a read operation may be temporarily stored in the buffer memory 2140.

The error correction circuit 2150 may perform an error correction encoding operation on program data, and perform an error correction decoding on read data. The error correction circuit 2150 may have error correction capacity of a predetermined level. For example, in the case where the number of error bits in the read data does not exceed the error correction capacity, the error correction circuit 2150 may detect errors included in the read data and correct the errors. The maximum of error bits that does not exceed the error correction capacity of the error correction circuit 2150 may be referred to as the maximum allowable error bit number. If the number of error bits in the read data exceeds the maximum allowable error bit number, the error correction decoding operation may fail.

The internal memory 2160 may be used as a storage for storing various information needed for the operation of the memory controller 2100. The internal memory 2160 may store a plurality of tables. For example, the internal memory 2160 may store an address mapping table in which logical addresses and physical addresses are mapped. For example, the internal memory 2160 may store at least one of the first to third tables.

Figure 16:
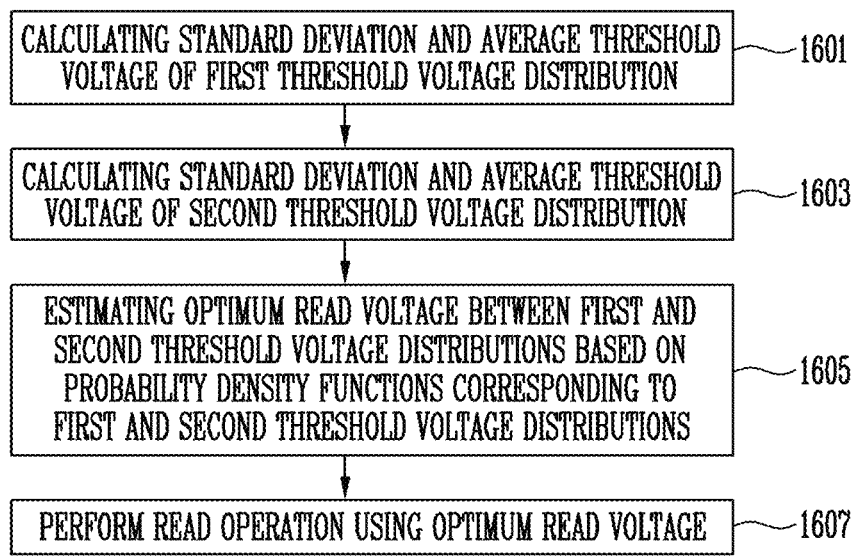
FIG. 16 is a flowchart for describing a method of operating the memory controller based on an embodiment of the disclosed technology.

FIG. 16 is a flowchart for describing a method of operating the memory controller based on an embodiment of the disclosed technology.

In an embodiment, operations 1601 to 1607 may be performed when the error correction decoding operation on the read data corresponding to the reference read voltage set fails.

At 1601, the memory controller 2100 may calculate a standard deviation and an average threshold voltage of the first threshold voltage distribution.

In some implementations, the memory controller 2100 may calculate the standard deviation of the first threshold voltage distribution, based on a first probability area of a first section distribution distinguished by a first target read voltage in the first threshold voltage distribution, a second probability area of a second section distribution distinguished by a second target read voltage in the first threshold voltage distribution, and inverse Q-function values respectively corresponding to the first and second probability areas.

In some implementations, the memory controller 2100 may calculate an average threshold voltage of the first threshold voltage distribution, based on an inverse Q-function corresponding to any one of the first and second probability areas and a standard deviation of the first threshold voltage distribution.

At 1603, the memory controller 2100 may calculate a standard deviation and an average threshold voltage of the second threshold voltage distribution adjacent to the first threshold voltage distribution.

In an embodiment, the memory controller 2100 may calculate a standard deviation and an average threshold voltage of the second threshold voltage distribution, in the same principle as that of the operation of calculating the standard deviation and the average threshold voltage of the first threshold voltage distribution.

In an embodiment, the memory controller 2100 may calculate a standard deviation of the second threshold voltage distribution based on the preset standard deviation ratio and the standard deviation of the first threshold voltage distribution in response to the channel characteristics of the memory cells. Here, the memory controller 2100 may calculate an average threshold voltage of the second threshold voltage distribution, based on the standard deviation of the second threshold voltage distribution and an inverse Q-function value corresponding to a third probability area of a third section distribution distinguished by a third target read voltage in the second threshold voltage distribution.

At 1605, the memory controller 2100 may estimate the optimum read voltage between the first and second threshold voltage distributions based on probability density functions corresponding to the first and second threshold voltage distributions. For example, the memory controller 2100 may input the standard deviations and the average threshold voltages estimated at step 1601 and step 1603 into the equation between the probability density functions, and estimate a solution of the equation as the optimum read voltage. For example, the memory controller 2100 may input the standard deviations and the average threshold voltages estimated at step 1601 and step 1603 into an approximation expression obtained by approximating the equation between the probability density functions, and estimate a solution of the approximation expression as the optimum read voltage. Here, the memory controller 2100 may replace at least one of a weight and an offset value included in the equation or the approximation expression with a preset value corresponding to the channel characteristics.

At 1607, the memory controller 2100 may perform a read operation using the estimated optimum read voltage. In the case where the error correction decoding operation on the read data corresponding to the estimated optimum read voltage has passed, the memory controller 2100 may include the estimated optimum read voltage in the reference read voltage set.

Here, the memory controller is configured to estimate an optimum read voltage that is used to distinguish one or more memory cells corresponding to a first threshold voltage distribution indicating first read-out data from one or more memory cells corresponding to a second threshold voltage distribution indicating second read-out data, a number of memory cells for first and second read-out data being expressed as a function of the threshold voltage to obtain first and second threshold voltage distribution curves, the first and second threshold voltage distribution curves being adjacent to each other among a plurality of threshold voltage distribution curves corresponding to the memory cells, the optimum read voltage being estimated based on standard deviations and average threshold voltages of the first and the second threshold voltage distributions and probability density functions corresponding to the first and the second threshold voltage distributions, respectively.

Figure 17:
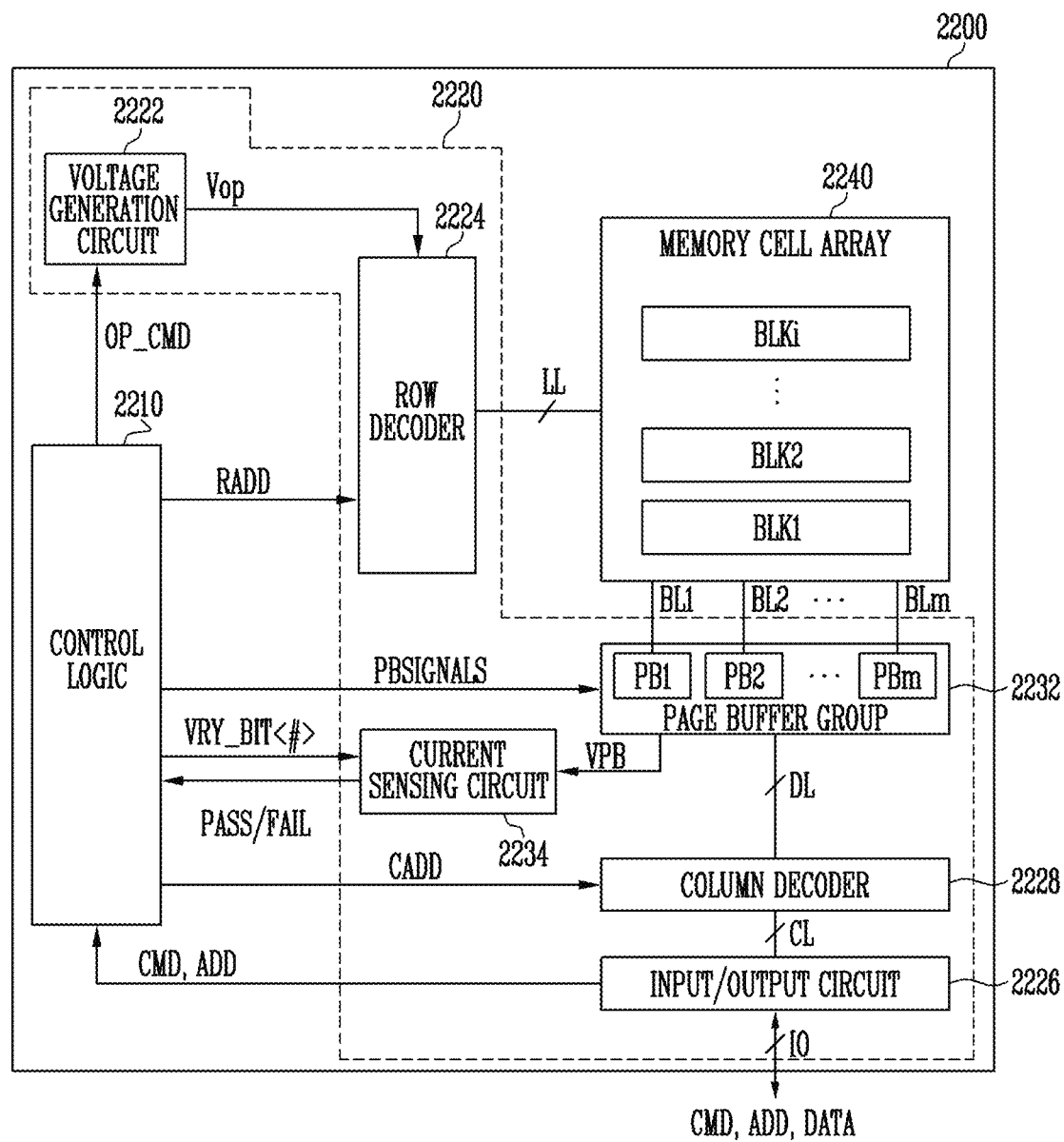
FIG. 17 is a diagram for describing a memory device based on an embodiment of the disclosed technology.

FIG. 17 is a diagram for describing a memory device 2200 based on an embodiment of the disclosed technology. The memory device 2200 illustrated in FIG. 17 may be applied to the memory system illustrated in FIGS. 1 and 15.

The memory device 2200 may include a control logic 2210, peripheral circuits 2220, and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under control of the memory controller 2100 illustrated in FIGS. 1 and 15.

The control logic 2210 may control the peripheral circuits 2220 in response to a command CMD and an address ADD which are received from the memory controller 2100 through the input/output circuit 2226. For example, the control logic 2210 may output an operating signal OP_CMD, a row address RADD, a column address CADD, page buffer control signals PBSIGNALS, and an enable bit VRY_BIT<#> in response to the command CMD and the address ADD. The control logic 2210 may determine whether a verify operation has passed or failed, in response to a pass signal PASS or a fail signal FAIL received from the current sensing circuit 2234.

The peripheral circuits 2220 may perform a program operation for storing data in the memory cell array 2240, a read operation for outputting the data stored in the memory cell array 2240, or an erase operation for erasing the data stored in the memory cell array 2240.

The voltage generation circuit 2222 may generate various operating voltages Vop to be used for the program operation, the read operation, or the erase operation in response to an operating signal OP_CMD received from the control logic 2210. For example, the voltage generation circuit 2222 may transmit a program voltage, a verify voltage, a pass voltage, a read voltage, an erase voltage, a turn-on voltage, etc. to the row decoder 2224.

The row decoder 2224 may transmit, in response to a row address RADD received from the control logic 2210, operating voltages Vop to local lines LL coupled to a selected one of the memory blocks included in the memory cell array 2240. The local lines LL may include local word lines, local drain select lines, and local source select lines. In addition, the local lines LL may include various lines such as source lines coupled to the memory blocks.

The input/output circuit 2226 may transmit, to the control logic 2210, a command CMD and an address ADD received from the memory controller through input/output lines 10, or may exchange data DATA with the column decoder 2228.

The column decoder 2228 may transmit data between the input/output circuit 2226 and the page buffer group 2232 in response to a column address CADD received from the control logic 2210. For example, the column decoder 2228 may exchange data with page buffers PB1 to PBm through data lines DL or exchange data with the input/output circuit 2226 through column lines CL.

The page buffer group 2232 may be coupled to the bit lines BL1 to BLm coupled in common to the memory blocks BLK1 to BLKi. The page buffer group 2232 may include the plurality of page buffers PB1 to PBm coupled to the bit lines BL1 to BLm. For example, a single page buffer may be coupled to each bit line. The page buffers PB1 to PBm may operate in response to page buffer control signals PBSIGNALS received from the control logic 2210. For example, during a program operation, the page buffers PB1 to PBm may temporarily store program data received from the memory controller, and adjust voltages to be applied to the bit lines BL1 to BLm according to the program data. Furthermore, during a read operation, the page buffers PB1 to PBm may temporarily store data received through the bit lines BL1 to BLm or sense voltages or current of the bit lines BL1 to BLm.

During a read operation or a verify operation, the current sensing circuit 2234 may generate a reference current in response to an enable bit VRY_BIT<#> received from the control logic 2210, and may compare a sensing voltage VPB received from the page buffer group 2232 with a reference voltage generated by the reference current and output a pass signal PASS or a fail signal FAIL.

The memory cell array 2240 may include a plurality of memory blocks BLK1 to BLKi configured to store data. User data and various information needed for operations of the memory device 2200 may be stored in the memory blocks BLK1 to BLKi. The memory blocks BLK1 to BLKi may be embodied in a two-dimensional structure or a three-dimensional structure, and have the same configuration.

Figure 18:
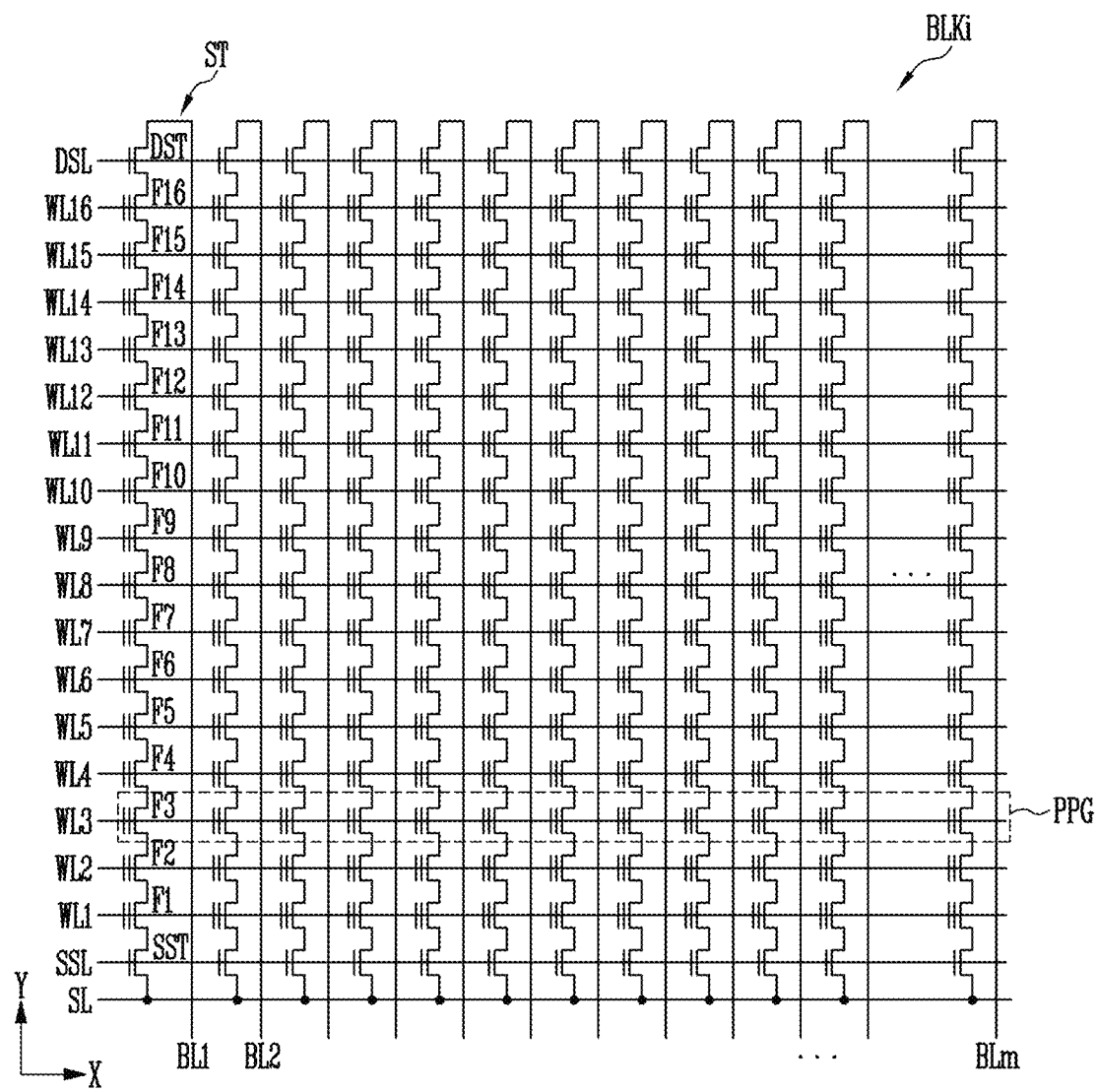
FIG. 18 is a diagram illustrating a memory block based on an embodiment of the disclosed technology.

FIG. 18 is a diagram illustrating a memory block based on an embodiment of the disclosed technology.

The memory cell array may include a plurality of memory blocks. For the sake of explanation, FIG. 18 illustrates any one memory block BLKi of the plurality of memory blocks.

In the memory block BLKi, a plurality of word lines arranged parallel to each other may be coupled between a first select line and a second select line. Here, the first select line may be a source select line SSL, and the second select line may be a drain select line DSL. In more detail, the memory block BLKi may include a plurality of strings ST coupled between the bit lines BL1 to BLm and the source line SL. The bit lines BL1 to BLm may be respectively coupled to the strings ST, and the source line SL may be coupled in common to the strings ST. The strings ST may have the same configuration; therefore, the string ST that is coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and a larger number of memory cells than the number of memory cells F1 to F16 shown in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells included in different strings ST, a group of memory cells coupled to each word line may be referred to as a physical page PPG. Therefore, the number of physical pages PPG included in the memory block BLKi may correspond to the number of word lines WL1 to WL16.

Figure 19:
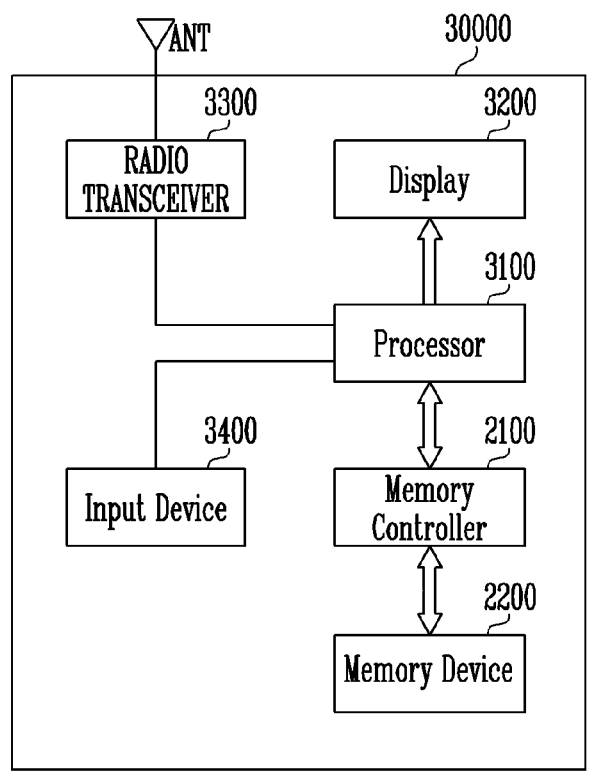
FIG. 19 is a diagram illustrating an example of a memory system including the memory controller illustrated in FIGS. 1 and 15.

FIG. 19 is a diagram illustrating an example of a memory system 30000 including the memory controller illustrated in FIGS. 1 and 15.

Referring to FIG. 19, the memory system 30000 may be embodied in a cellular phone, a smartphone, a tablet personal computer (PC), a personal digital assistant (PDA) or a wireless communication device. The memory system 30000 may include a memory device 2200 and a memory controller 2100 configured to control the operation of the memory device 2200.

The memory controller 2100 may control a data access operation, e.g., a program operation, an erase operation, or a read operation, of the memory device 2200 under control of a processor 3100.

Data programmed in the memory device 2200 may be outputted through a display 3200 under control of the memory controller 2100.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal outputted from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal outputted from the processor 3100 into a radio signal, and output the changed radio signal to an external device through the antenna ANT.

An input device 3400 may be used to input a control signal for controlling the operation of the processor 3100 or data to be processed by the processor 3100. The input device 3400 may be embodied in a pointing device such as a touch pad or a computer mouse, a keypad, a keyboard, or an image sensor.

The processor 3100 may control the operation of the display 3200 such that data outputted from the memory controller 2100, data outputted from the radio transceiver 3300, or data outputted form the input device 3400 is outputted through the display 3200.

In an embodiment, the memory controller 2100 capable of controlling the operation of the memory device 2200 may be embodied as a part of the processor 3100 or a chip provided separately from the processor 3100.

Figure 20:
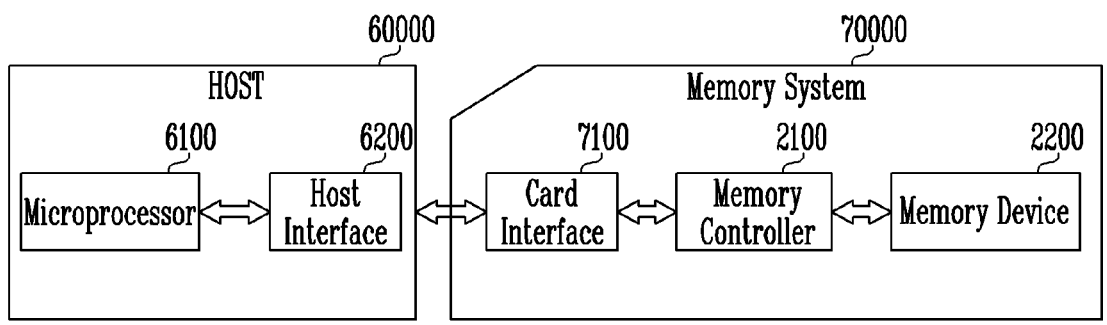
FIG. 20 is a diagram illustrating an example of a memory system including the memory controller illustrated in FIGS. 1 and 15.

FIG. 20 is a diagram illustrating an example of a memory system 70000 including the memory controller illustrated in FIGS. 1 and 15.

Referring to FIG. 20, the memory system 70000 may be embodied in a memory card or a smart card. The memory system 70000 may include a memory device 2200, a memory controller 2100, and a card interface 7100.

The controller 2100 may control data exchange between the memory device 2200 and the card interface 7100. In an embodiment, the card interface 7100 may be a secure digital (SD) card interface or a multimedia card (MMC) interface, but the disclosed technology is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 2200 through the card interface 7100 and the memory controller 2100 under control of a microprocessor 6100.

In various embodiments of the disclosed technology, data having enhanced reliability may be obtained.

In various embodiments of the disclosed technology, an accurate optimum read voltage between programmed states may be obtained.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosed technology as set forth in the following claims.

What is claimed is:

1. A memory system comprising:
   a memory device including a plurality of memory cells; and
   a memory controller configured to estimate and use a read voltage to distinguish one or more memory cells corresponding to a first threshold voltage distribution indicating first read-out data from one or more memory cells corresponding to a second threshold voltage distribution indicating second read-out data, the first and second threshold voltage distribution being adjacent to each other among a plurality of threshold voltage distributions corresponding to the memory cells, the read voltage being estimated based on standard deviations and average threshold voltages of the first and the second threshold voltage distributions and probability density functions corresponding to the first and the second threshold voltage distributions, respectively,
   wherein the memory controller calculates the standard deviation of the first threshold voltage distribution, based on a first probability area corresponding to a first section of the first threshold voltage distribution distinguished by a first target read voltage, a second probability area corresponding to a second section of the first threshold voltage distribution distinguished by a second target read voltage, and inverse Q-function values respectively corresponding to the first and the second probability areas.

2. The memory system according to claim 1, wherein the memory controller calculates the first and the second probability areas based on first read data and second read data received based on the first and the second target read voltages, respectively.

3. The memory system according to claim 2, wherein the memory controller calculates the first and the second probability areas by comparing a preset number of memory cells corresponding to each of the plurality of threshold voltage distributions with a number of first bit values included in the first read data and the second read data.

4. The memory system according to claim 1, wherein the memory controller calculates the standard deviation of the first threshold voltage distribution, based on a difference value between the first and the second target read voltages and a difference value between the inverse Q-function values respectively corresponding to the first and the second probability areas.

5. The memory system according to claim 1, wherein the memory controller calculates the average threshold voltage of the first threshold voltage distribution, based on an inverse Q-function corresponding to any one of the first and the second probability areas and the standard deviation of the first threshold voltage distribution.

6. The memory system according to claim 1, wherein the memory controller determines the first and the second target read voltages such that a difference value between the first and the second target read voltages is equal to or greater than a first threshold value.

7. The memory system according to claim 1, wherein the memory controller determines the first and the second target read voltages such that a difference value between the first and the second probability areas is equal to or greater than a second threshold value.

8. The memory system according to claim 1, wherein the memory controller determines the first and the second target read voltages such that each of the first and the second probability areas is within a preset threshold range.

9. The memory system according to claim 1, wherein the memory controller calculates the standard deviation of the second threshold voltage distribution, based on a third probability area corresponding to a third section of the second threshold voltage distribution distinguished by a third target read voltage, a fourth probability area corresponding to a fourth section of the second threshold voltage distribution distinguished by a fourth target read voltage, and inverse Q-function values respectively corresponding to the third and the fourth probability areas.

10. The memory system according to claim 1, wherein the memory controller calculates the standard deviation of the second threshold voltage distribution based on the standard deviation of the first threshold voltage distribution and a standard deviation ratio preset based on channel characteristics of the memory cells.

11. The memory system according to claim 10, wherein the memory controller calculates the average threshold voltage of the second threshold voltage distribution, based on the standard deviation of the second threshold voltage distribution and an inverse Q-function value corresponding to a third probability area corresponding to a third section of the second threshold voltage distribution distinguished by a third target read voltage.

12. The memory system according to claim 10, wherein the channel characteristics corresponds to at least one of a program/erase cycle and a retention time.

13. The memory system according to claim 1,
    wherein the memory controller estimates the read voltage based on the average threshold voltage of the first threshold voltage distribution, a first weight corresponding to the average threshold voltage of the first threshold voltage distribution, the average threshold voltage of the second threshold voltage distribution, a second weight corresponding to the average threshold voltage of the second threshold voltage distribution, and an offset value, and
    wherein the first weight, the second weight, and the offset value are preset based on channel characteristics of the memory cells.

14. The memory system according to claim 1, wherein the memory controller estimates the read voltage based on an approximation using the probability density functions.

15. The memory system according to claim 14,
wherein the approximation is obtained based on the average threshold voltage of the first threshold voltage distribution, a first weight corresponding to the average threshold voltage of the first threshold voltage distribution, the average threshold voltage of the second threshold voltage distribution, and a second weight corresponding to the average threshold voltage of the second threshold voltage distribution, and
wherein the first weight and the second weight are preset based on channel characteristics of the memory cells.

16. The memory system according to claim 15, wherein the approximation is associated with an offset value preset based on the channel characteristics of the memory cells.

17. The memory system according to claim 1, wherein the threshold voltage distributions have Gaussian distribution characteristics or distribution characteristics close to a Gaussian distribution.

18. The memory system according to claim 1, wherein the memory controller performs a read operation on the memory cells using the estimated read voltage.

19. A method of operating a memory system comprising:
calculating standard deviations and average threshold voltages of first and second threshold voltage distributions, the first threshold voltage distribution corresponding to memory cells storing first read-out data, the second threshold voltage distribution corresponding to memory cells storing second read-out data, a number of memory cells for first and second read-out data being expressed as a function of the threshold voltage to obtain first and second threshold voltage distribution, the first and second threshold voltage distribution being adjacent to each other among a plurality of threshold voltage distributions corresponding to a plurality of memory cells; and
estimating a read voltage between the first and the second threshold voltage distributions based on probability density functions corresponding to the first and the second threshold voltage distributions, respectively,
wherein calculating the standard deviation of the first threshold voltage distribution comprises calculating the standard deviation of the first threshold voltage distribution, based on a first probability area corresponding to a first section of the first threshold voltage distribution distinguished by a first target read voltage, a second probability area corresponding to a second section of the first threshold voltage distribution distinguished by a second target read voltage, and inverse Q-function values respectively corresponding to the first and the second probability areas.

20. The method according to claim 19, further comprising calculating the first and the second probability areas based on first read data and second read data received based on the first and the second target read voltages, respectively.

21. The method according to claim 20, wherein calculating the first and the second probability areas comprises calculating the first and the second probability areas by comparing a preset number of memory cells corresponding to each of the plurality of threshold voltage distributions with a number of first bit values included in the first read data and the second read data.

22. The method according to claim 19, wherein calculating the standard deviation of the first threshold voltage distribution comprises calculating the standard deviation of the first threshold voltage distribution, based on a difference value between the first and the second target read voltages and a difference value between the inverse Q-function values respectively corresponding to the first and the second probability areas.

23. The method according to claim 19, further comprising calculating the average threshold voltage of the first threshold voltage distribution, based on an inverse Q-function corresponding to any one of the first and the second probability areas and a standard deviation of the first threshold voltage distribution.

24. The method according to claim 19, further comprising determining the first and the second target read voltages such that a difference value between the first and second target read voltages is equal to or greater than a first threshold value.

25. The method according to claim 19, further comprising determining the first and the second target read voltages such that a difference value between the first and the second probability areas is equal to or greater than a second threshold value.

26. The method according to claim 19, further comprising determining the first and the second target read voltages such that each of the first and the second probability areas is within a preset threshold range.

27. The method according to claim 19, further comprising calculating the standard deviation of the second threshold voltage distribution, based on a third probability area corresponding to a third section of the second threshold voltage distribution distinguished by a third target read voltage, a fourth probability area corresponding to a fourth section of the second threshold voltage distribution distinguished by a fourth target read voltage, and inverse Q-function values respectively corresponding to the third and the fourth probability areas.

28. The method according to claim 19, further comprising calculating the standard deviation of the second threshold voltage distribution based on the standard deviation of the first threshold voltage distribution and a standard deviation ratio preset based on channel characteristics of the memory cells.

29. The method according to claim 28, further comprising calculating an average threshold voltage of the second threshold voltage distribution, based on the standard deviation of the second threshold voltage distribution and an inverse Q-function value corresponding to a third probability area corresponding to a third section of the second threshold voltage distribution distinguished by a third target read voltage.

30. The method according to claim 28, wherein the channel characteristics corresponds to at least one of a program/erase cycle and a retention time.

31. The method according to claim 19, wherein estimating the read voltage comprises estimating the read voltage using a solution of an equation between the probability density functions.

32. The method according to claim 31,
wherein the solution of the equation is expressed as an average threshold voltage of the first threshold voltage distribution, a first weight corresponding to the average threshold voltage of the first threshold voltage distribution, an average threshold voltage of the second threshold voltage distribution, a second weight corresponding to the average threshold voltage of the second threshold voltage distribution, and an offset value, and wherein the first weight, the second weight, and the offset value are preset based on the channel characteristics of the memory cells.

33. The method according to claim 19, wherein estimating the read voltage comprises estimating the read voltage using a solution of an approximation expression obtained by approximating an equation between the probability density functions.

34. The method according to claim 33,
wherein the solution of the approximation expression is expressed as an average threshold voltage of the first threshold voltage distribution, a first weight corresponding to the average threshold voltage of the first threshold voltage distribution, an average threshold voltage of the second threshold voltage distribution, and a second weight corresponding to the average threshold voltage of the second threshold voltage distribution, and
wherein the first weight and the second weight are preset based on channel characteristics of the memory cells.

35. The method according to claim 34, wherein the solution of the approximation expression further includes an offset value preset based on the channel characteristics of the memory cells.

36. The method according to claim 19, wherein the threshold voltage distributions have Gaussian distribution characteristics or distribution characteristics close to a Gaussian distribution.

37. The method according to claim 19, further comprising performing a read operation on the memory cells using the estimated read voltage.

* * * * *